US012626744B2

(12) United States Patent
Sugiura et al.

(10) Patent No.: US 12,626,744 B2
(45) Date of Patent: May 12, 2026

(54) MAGNETIC MEMORY DEVICE

(71) Applicant: Kioxia Corporation, Tokyo (JP)

(72) Inventors: Kuniaki Sugiura, Seoul (KR); Yosuke Kobayashi, Seoul (KR); Naoki Matsushita, Seoul (KR); Masayoshi Iwayama, Seoul (KR)

(73) Assignee: Kioxia Corporation, Tokyo (JP)

( * ) Notice: Subject to any disclaimer, the term of this patent is extended or adjusted under 35 U.S.C. 154(b) by 146 days.

(21) Appl. No.: 18/599,540

(22) Filed: Mar. 8, 2024

(65) Prior Publication Data

US 2024/0321335 A1     Sep. 26, 2024

(30) Foreign Application Priority Data

Mar. 24, 2023     (JP) ................................. 2023-048391

(51) Int. Cl.
*G11C 11/16*     (2006.01)
*H10B 61/00*     (2023.01)

(52) U.S. Cl.
CPC .......... *G11C 11/1673* (2013.01); *H10B 61/10* (2023.02)

(58) Field of Classification Search
CPC .............. G11C 11/1673; G11C 11/161; G11C 11/1655; G11C 11/1659; G11C 11/1675; G11C 11/1693; G11C 11/1657; G11C 11/1697; H10B 61/10; H10B 61/22; H10N 50/10
See application file for complete search history.

(56) References Cited

U.S. PATENT DOCUMENTS

| | | | |
|---|---|---|---|
| 6,927,996 B2 | 8/2005 | Eaton et al. | |
| 8,351,252 B2 * | 1/2013 | Chung ..................... | G11C 7/04 |
| | | | 365/207 |
| 9,530,479 B2 | 12/2016 | Abedifard | |
| 10,985,210 B2 | 4/2021 | Nakayama et al. | |
| 11,074,954 B2 | 7/2021 | Osada et al. | |
| 11,386,944 B2 | 7/2022 | Hatsuda | |
| 11,527,276 B2 | 12/2022 | Katayama | |

(Continued)

FOREIGN PATENT DOCUMENTS

| | | |
|---|---|---|
| JP | 2005109500 A | 4/2005 |
| JP | 2020155186 A | 9/2020 |

(Continued)

OTHER PUBLICATIONS

Park, et al., "Low RA Magnetic Tunnel Junction Arrays in Conjunction with Low Switching Current and High Breakdown Voltage for STT-MRAM at 10 nm and Beyond", 2018 IEEE Symposium on VLSI Technology, pp. 185-186, 2018.

*Primary Examiner* — Khamdan N. Alrobaie
(74) *Attorney, Agent, or Firm* — Holtz, Holtz & Volek PC

(57)     ABSTRACT

A magnetic memory device according to an embodiment includes a magnetic memory device includes first and second interconnect, a memory cell, a transistor, first and second sense amplifiers, and a control circuit. The memory cell includes a magnetoresistive effect element and a selector element. The magnetoresistive effect element and the selector element are coupled in series between the first and second interconnect. In a read operation, the control circuit is further configured to: charge the first interconnect to a first voltage; and discharge the first interconnect via the transistor by applying a second voltage to a gate end of the transistor.

10 Claims, 13 Drawing Sheets

(56) References Cited

U.S. PATENT DOCUMENTS

| | | | |
|---|---|---|---|
| 11,908,501 B2 | 2/2024 | Katayama et al. | |
| 2009/0103354 A1* | 4/2009 | Yoon ................... | G11C 11/1673 |
| | | | 365/158 |
| 2011/0199812 A1* | 8/2011 | Kitagawa ........... | G11C 13/0004 |
| | | | 365/210.1 |
| 2013/0322161 A1* | 12/2013 | Noguchi ............. | G11C 11/1659 |
| | | | 365/158 |
| 2018/0277188 A1* | 9/2018 | Fujino ................ | G11C 11/1655 |
| 2022/0335998 A1 | 10/2022 | Tran et al. | |

FOREIGN PATENT DOCUMENTS

| | | | |
|---|---|---|---|
| JP | 2020155630 A | 9/2020 |
| JP | 2021047950 A | 3/2021 |
| JP | 2021106066 A | 7/2021 |
| JP | 2022137794 A | 9/2022 |
| JP | 2022164558 A | 10/2022 |

* cited by examiner

MS
F I G. 1
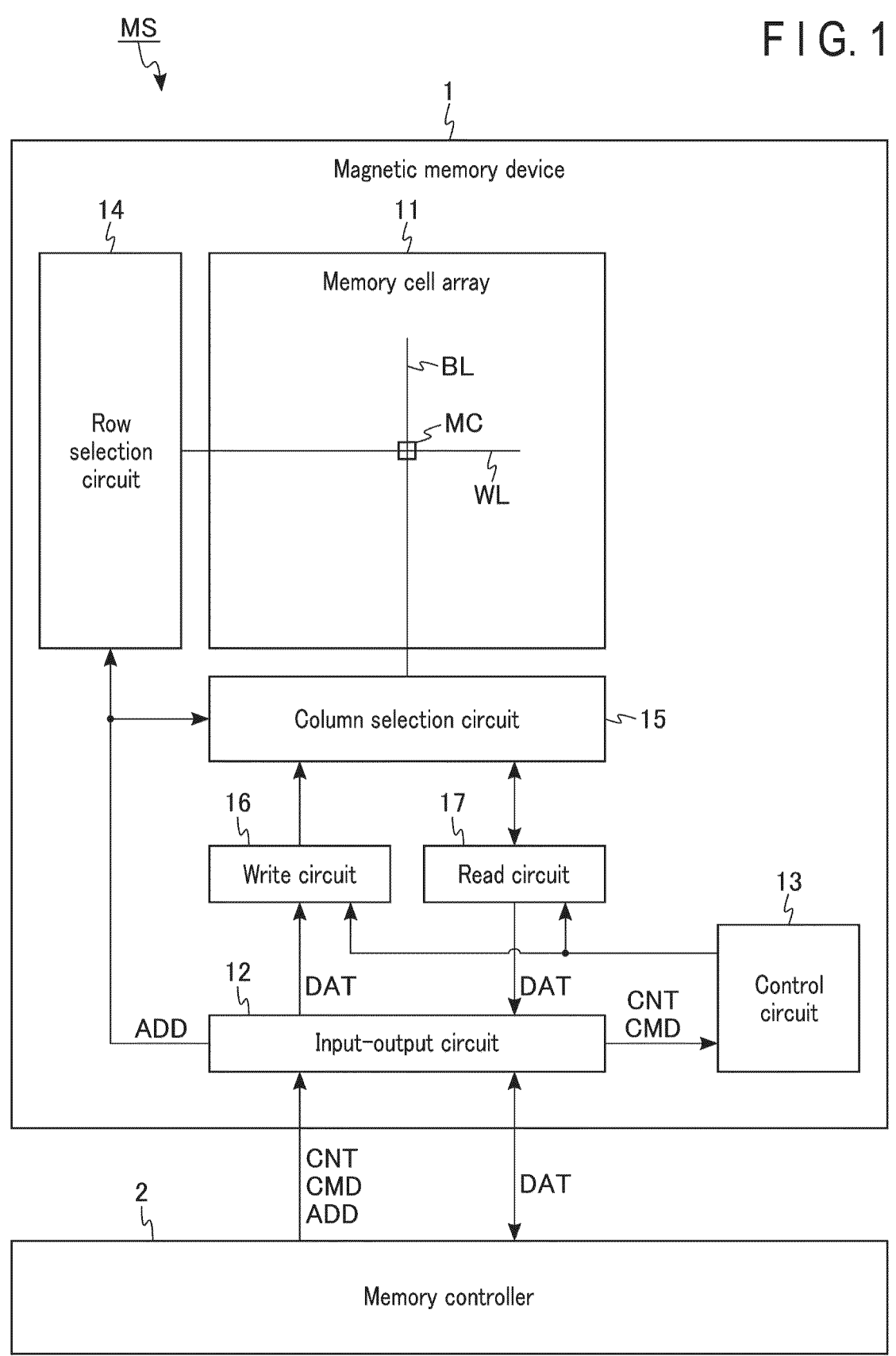

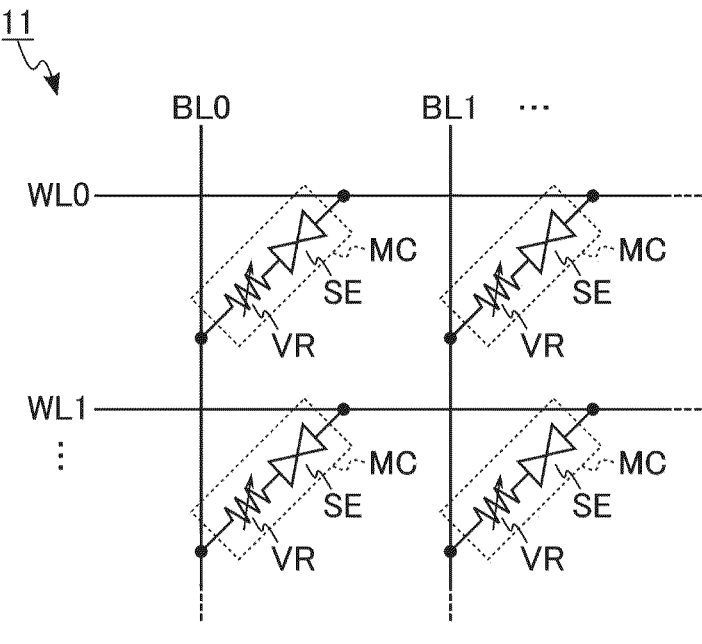
F I G. 2
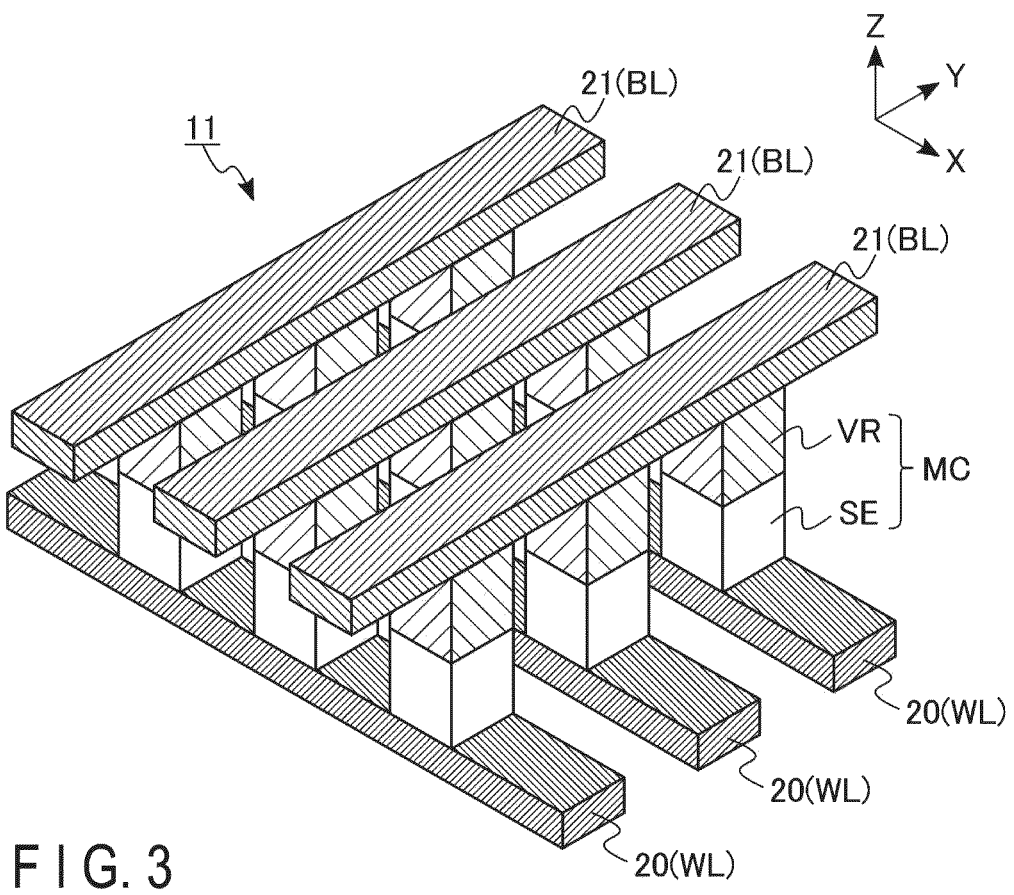
F I G. 3

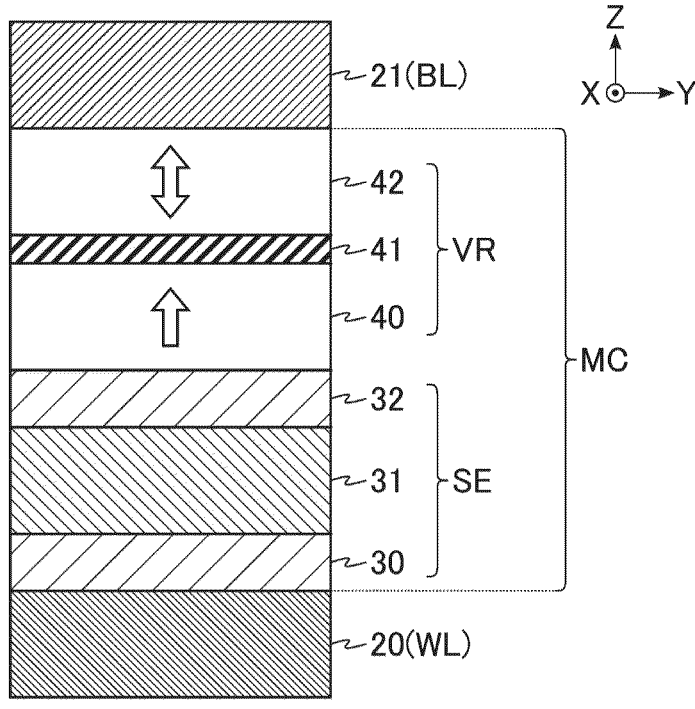
F I G. 4

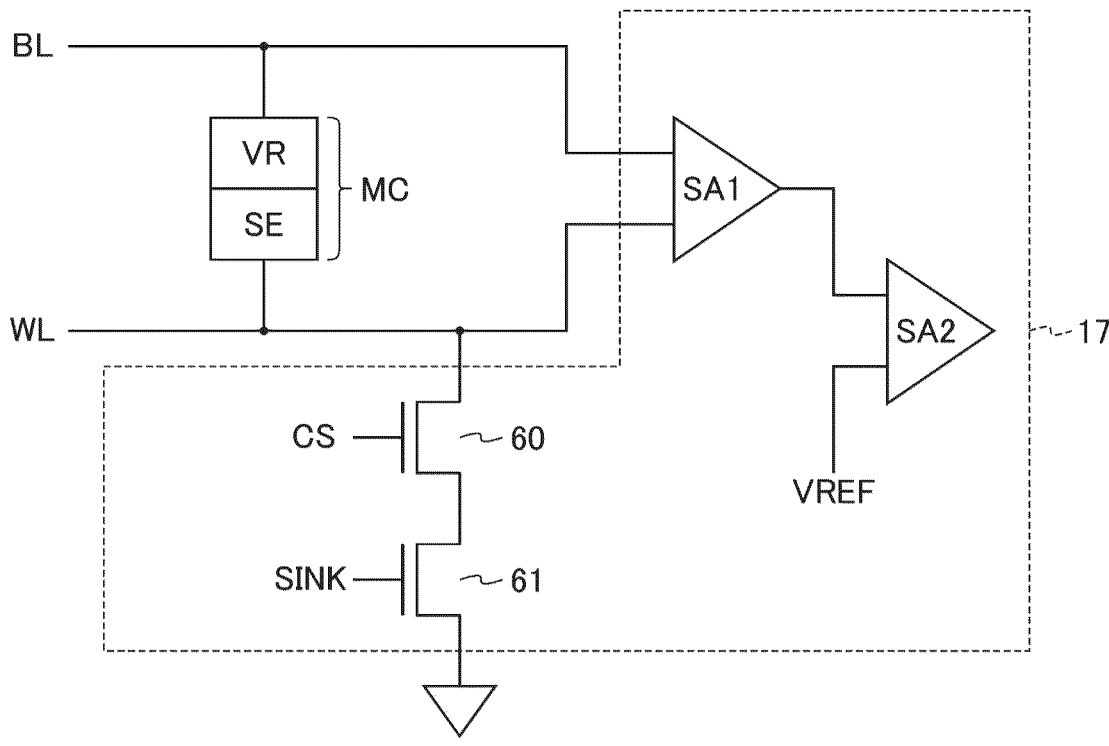
F I G. 5
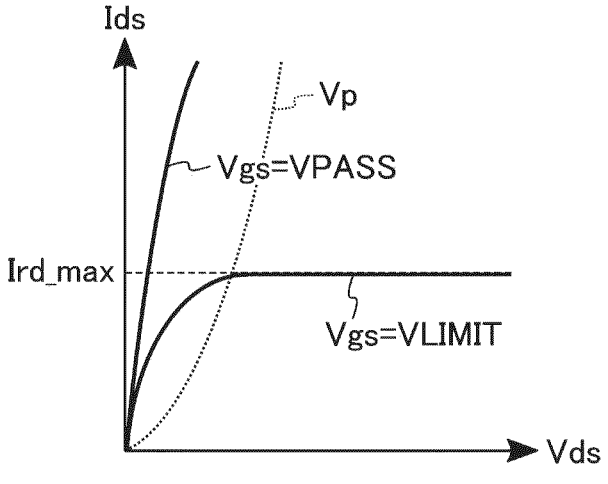
F I G. 6

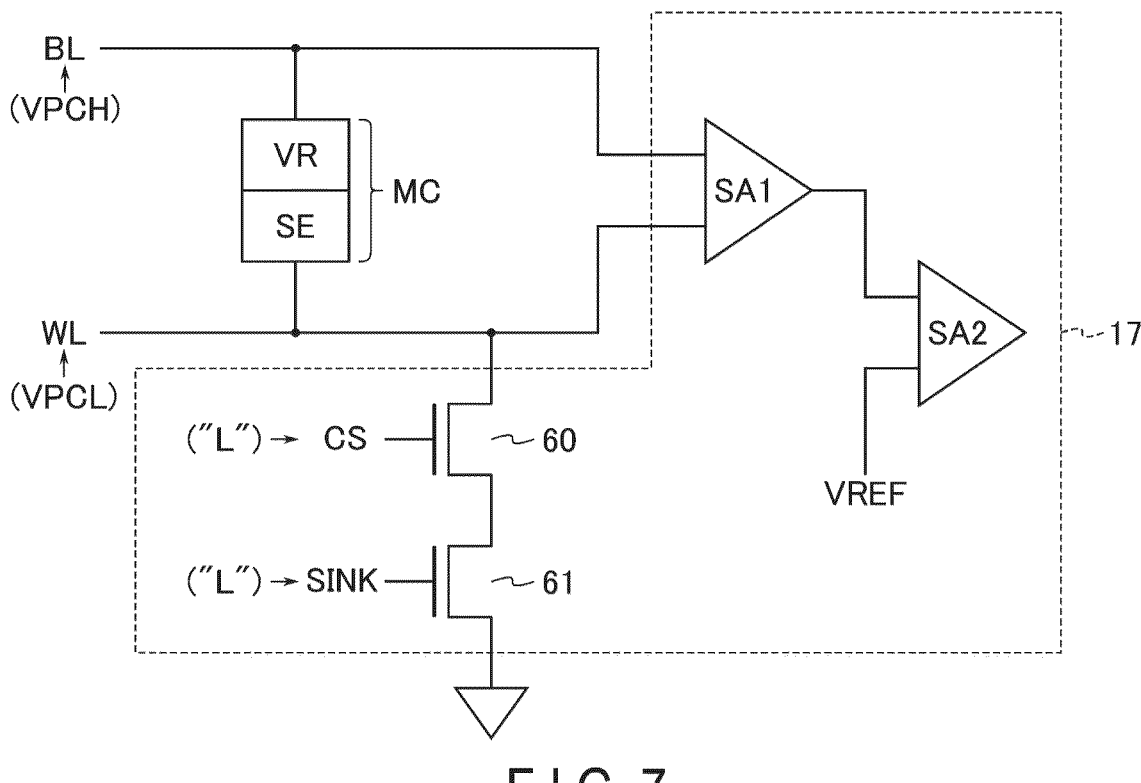
F I G. 7
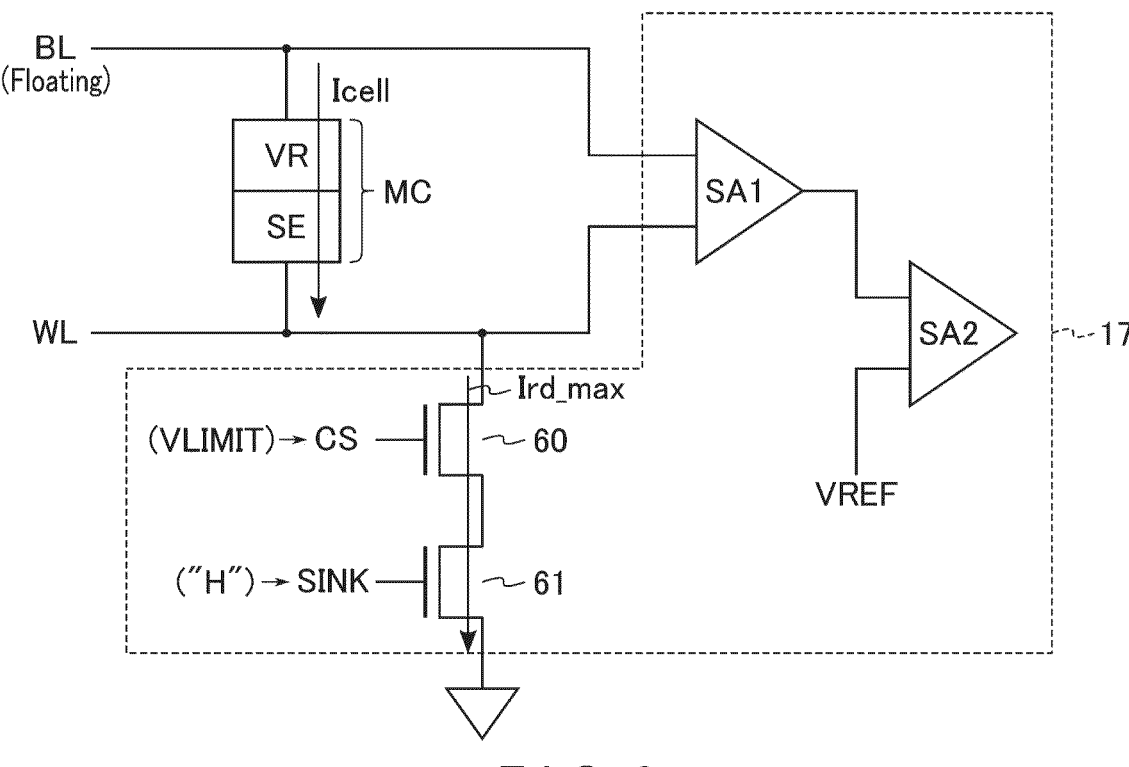
F I G. 8

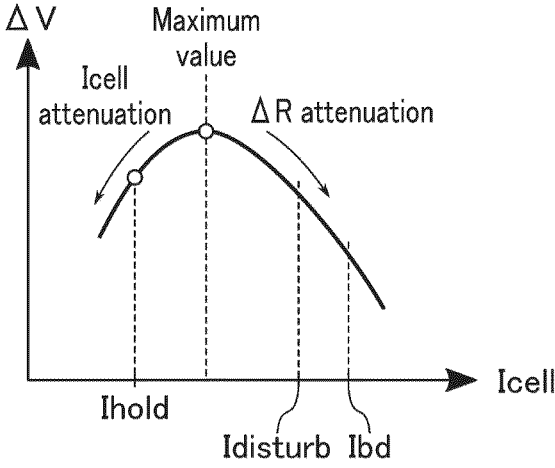
F I G. 10
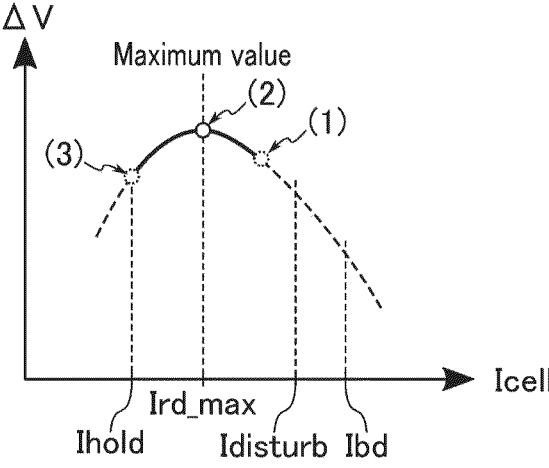
F I G. 11

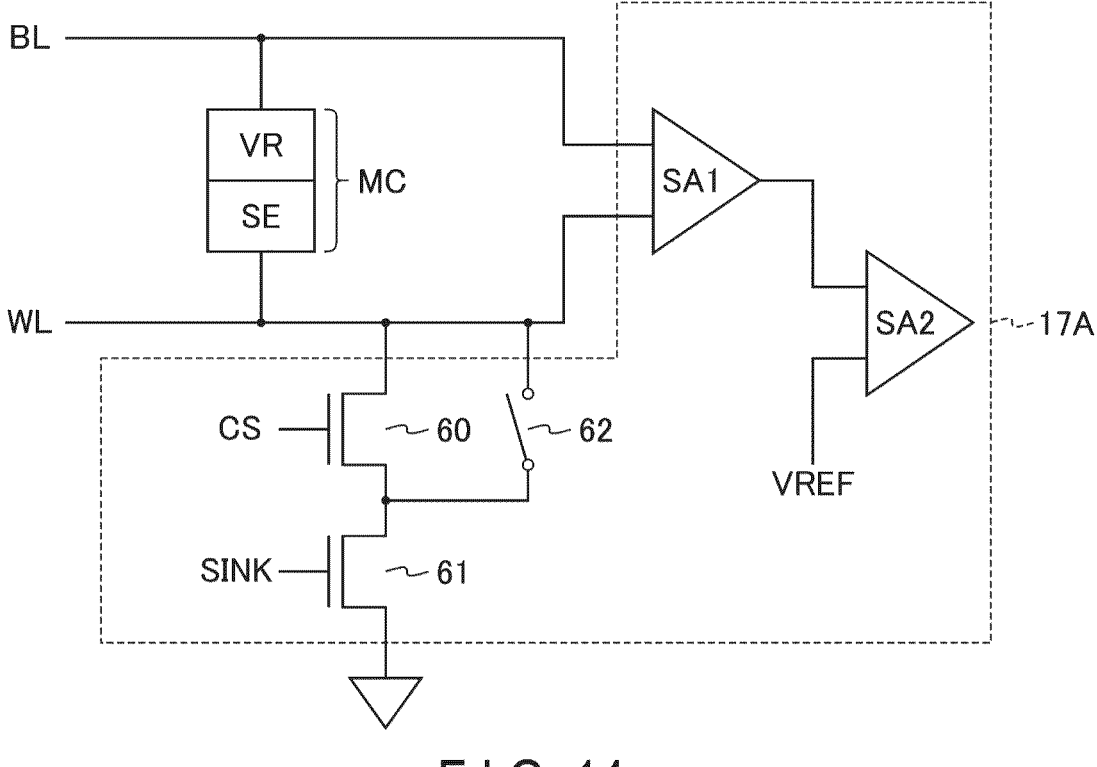
F I G. 14

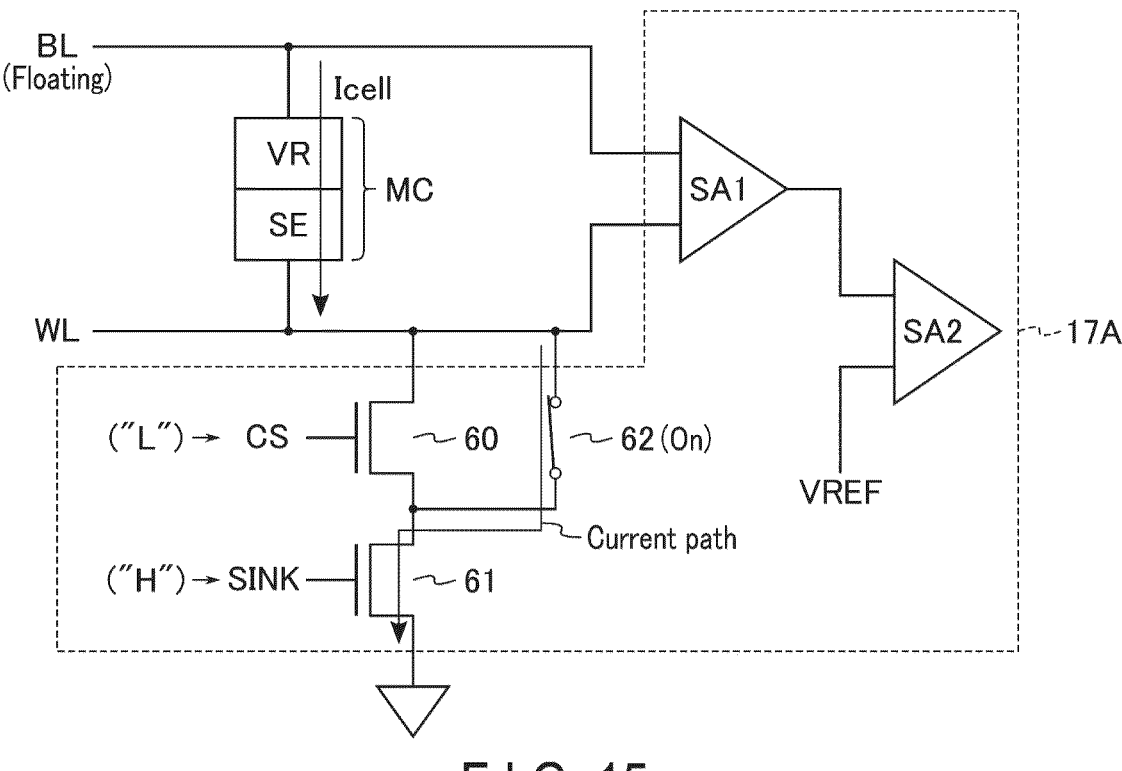
F I G. 15
F I G. 16

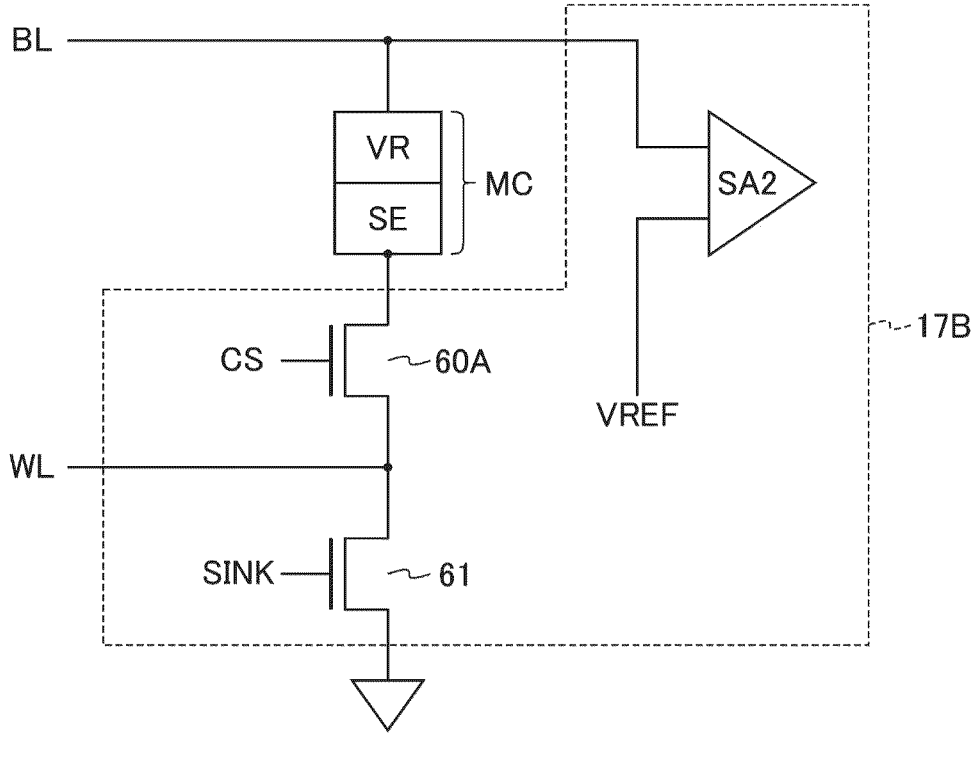
F I G. 17

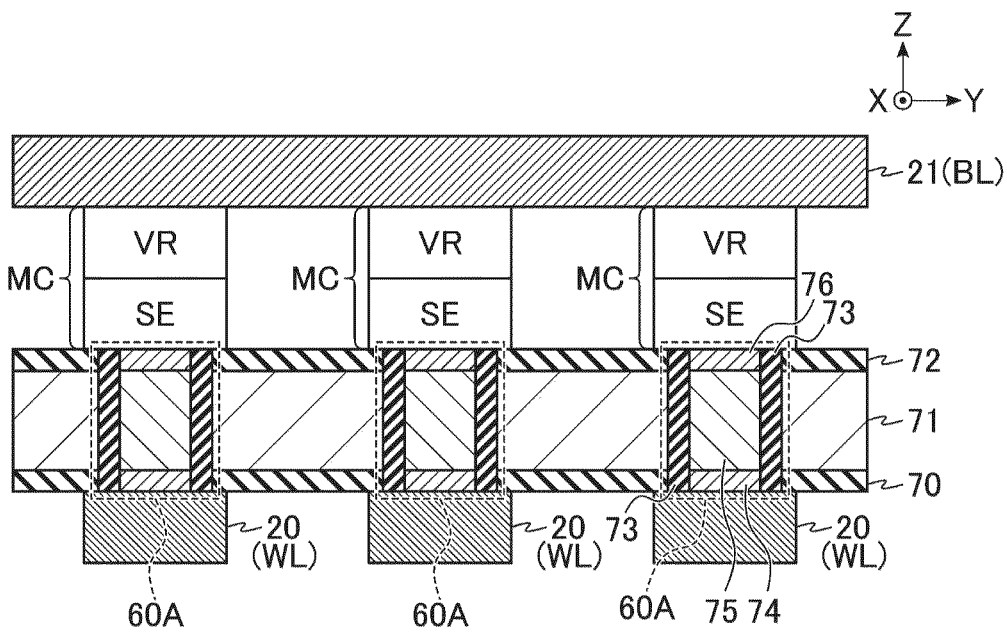
F I G. 18

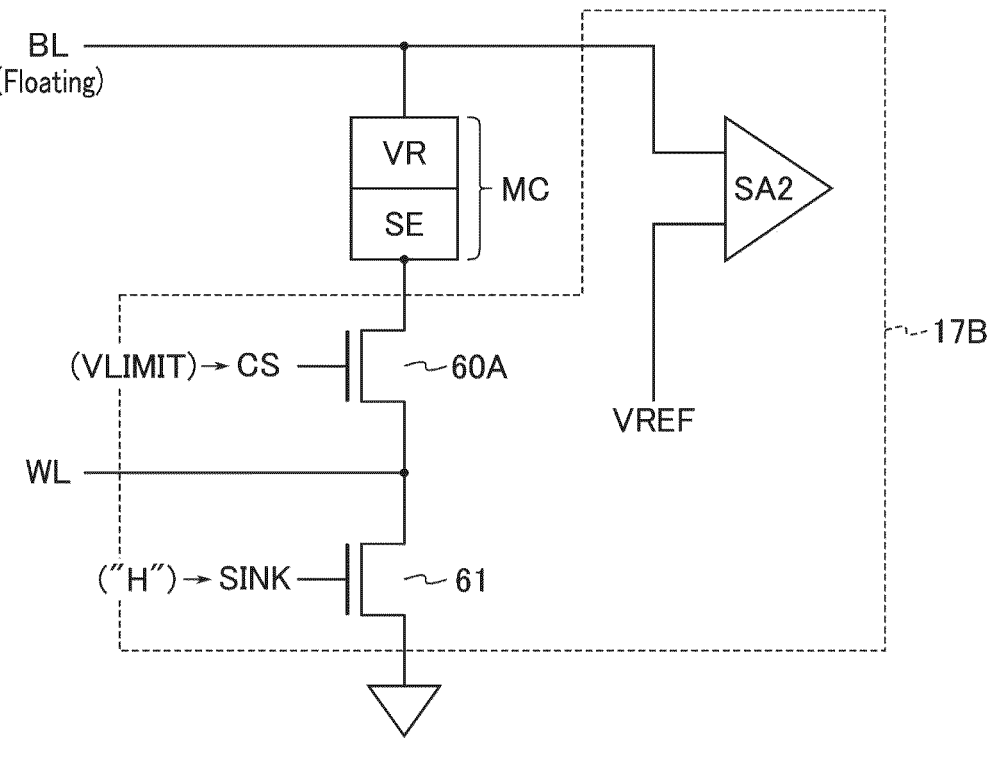
F I G. 19
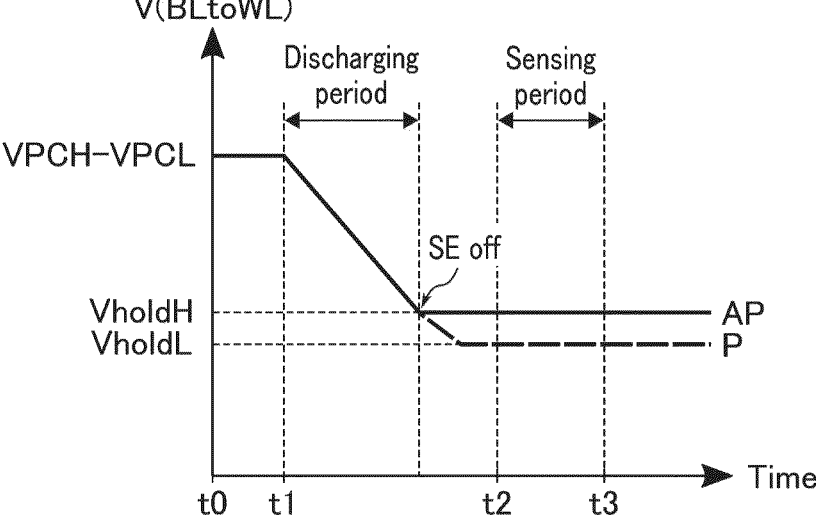
F I G. 20

MAGNETIC MEMORY DEVICE

CROSS-REFERENCE TO RELATED APPLICATION(S)

This application is based upon and claims the benefit of priority from Japanese Patent Application No. 2023-048391, filed Mar. 24, 2023, the entire contents of which are incorporated herein by reference.

FIELD

Embodiments described herein relate generally to a magnetic memory device.

BACKGROUND

A memory device (magnetoresistive random-access memory (MRAM)) which adopts a magnetoresistance effect element as a memory element is known.

BRIEF DESCRIPTION OF THE DRAWINGS

FIG. 1 is a block diagram showing an example of an overall configuration of a memory system that includes a magnetic memory device according to a first embodiment.

FIG. 2 is a circuit diagram illustrating an example of a circuit configuration of a memory cell array provided in the magnetic memory device of the first embodiment.

FIG. 3 is a perspective view illustrating an example of a configuration of the memory cell array provided in the magnetic memory device of the first embodiment.

FIG. 4 is a cross-sectional view illustrating an example of a cross-sectional structure of a memory cell included in the memory cell array provided in the magnetic memory device of the first embodiment.

FIG. 5 is a circuit diagram showing an example of a circuit configuration of a read circuit provided in the magnetic memory device according to the first embodiment.

FIG. 6 is a graph illustrating an example of static characteristics of a current-limiting transistor in the magnetic memory device according to the first embodiment.

FIG. 7 is a schematic view illustrating an example of an operation state during a pre-charge period of a read operation in the magnetic memory device according to the first embodiment.

FIG. 8 is a schematic view illustrating an example of an operation state during a discharge period of a read operation in the magnetic memory device according to the first embodiment.

FIG. 10 is a graph illustrating an example of a relationship between a read current and a difference between a voltage at both ends of a memory cell in a parallel state and a voltage at both ends of a memory cell in an anti-parallel state.

FIG. 11 is a graph illustrating an example of a relationship between a read current and a difference between a voltage at both ends of a memory cell in a parallel state and a voltage at both ends of a memory cell in an anti-parallel state in a read operation in a magnetic memory device according to the first embodiment.

FIG. 14 is a circuit diagram showing an example of a circuit configuration of a read circuit provided in a magnetic memory device according to a third embodiment.

FIG. 15 is a schematic view illustrating an example of an operation state during a non-sensing period of a read operation in the magnetic memory device according to the third embodiment.

FIG. 16 is a schematic view illustrating an example of an operation state during a sensing period of a read operation in the magnetic memory device according to the third embodiment.

FIG. 17 is a circuit diagram illustrating an example of a circuit configuration of a read circuit provided in a magnetic memory device according to a fourth embodiment.

FIG. 18 is a cross-sectional view illustrating an example of a cross-sectional structure of a memory cell array provided in the magnetic memory device of the fourth embodiment.

FIG. 19 is a schematic view illustrating an example of an operation state during a discharge period of a read operation in the magnetic memory device according to the fourth embodiment.

FIG. 20 is a timing chart of a change in a voltage difference between a bit line and a word line WL in a read operation of the magnetic memory device according to the fourth embodiment.

DETAILED DESCRIPTION

Figure 9:
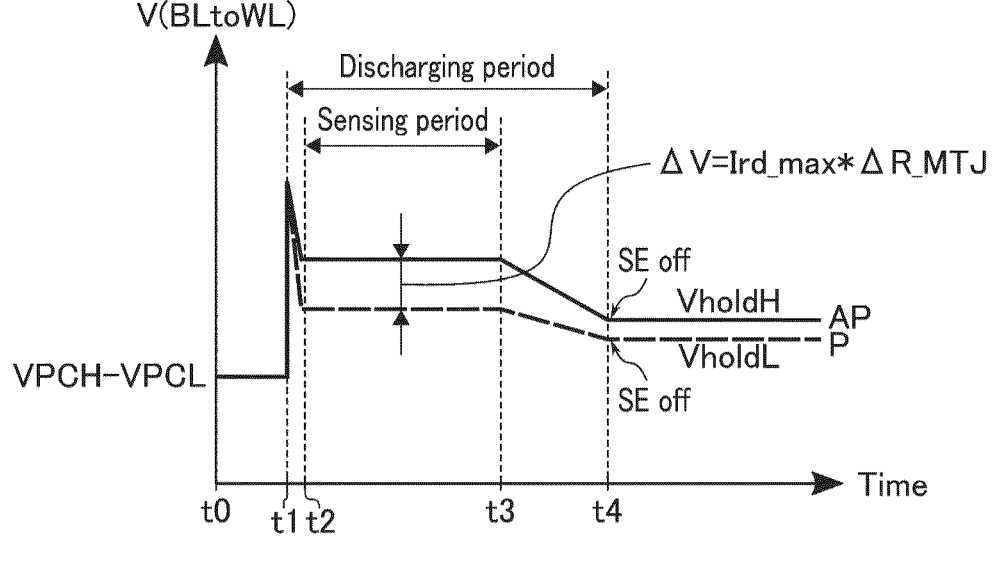
FIG. 9 is a timing chart of a change in a voltage difference between a bit line and a word line in a read operation in the magnetic memory device according to the first embodiment.

In general, according to one embodiment, a magnetic memory device includes a first interconnect, a second interconnect, a memory cell, a transistor, a first sense amplifier, a second sense amplifier, and a control circuit. The memory cell includes a magnetoresistive effect element and a selector element. The magnetoresistive effect element and the selector element are coupled in series between the first interconnect and the second interconnect. The transistor is coupled between the second interconnect and a ground node. The first sense amplifier is configured to amplify a voltage difference between the first interconnect and the second interconnect. The second sense amplifier is configured to determine data stored in the memory cell based on a result of comparing an output voltage of the first sense amplifier with a reference voltage. The control circuit is configured to perform a read operation. In the read operation, the control circuit is further configured to: charge the first interconnect to a first voltage; and discharge, after charging the first interconnect, the first interconnect via the transistor by applying a second voltage to a gate end of the transistor, wherein the transistor to which the second voltage is applied limits a current flowing between one end and the other end of the transistor to a first current; and cause the first sense amplifier to amplify a voltage difference between the first interconnect that has been discharged via the transistor and the second interconnect and causes the second sense amplifier to determine data stored in the memory cell.

Hereinafter, embodiments will be described with reference to the drawings. The drawings referred to hereinafter are schematic or conceptual. The dimensions and ratios, etc. in the drawings are not always the same as the actual ones. In the descriptions below, constituent elements having substantially the same function and configuration will be denoted by the same reference symbol. A numeral, etc., following letters constituting a reference symbol is used to distinguish between elements with the same configuration and which are referred to by reference symbols including the same letters. When elements represented by reference symbols that include the same characters need not be distinguished from one another, they are referred to by reference symbols that include only characters.

In the present specification, the term "coupling" means that elements are electrically coupled to each other but another element may be interposed therebetween. A transistor or a switch circuit in an on state is turned to be in a conductive state between one and the other ends. An "off state" of a transistor or a switch circuit does not exclude the case where a minute current such as a leak current flows. An "H" level is a voltage level at which an N-type transistor is turned to an on state when the voltage is applied at the gate end, and at which a P-type transistor is turned to an off state when the voltage is applied at the gate end. The "L" level is a voltage level at which an N-type transistor is turned to an off state when the voltage is applied to the gate end, and at which a P-type transistor is turned to an on state when the voltage is applied to the gate end.

<1> First Embodiment

The magnetic memory device 1 of the first embodiment is described below.
<1-1> Configuration
<1-1-1> Overall Configuration of Memory System MS
FIG. 1 is a block diagram showing a configuration example of a memory system MS that includes a magnetic memory device 1 according to the first embodiment. As shown in FIG. 1, the memory system MS includes a magnetic memory device 1 and a memory controller 2. The magnetic memory device 1 operates based on a control by the memory controller 2. The memory controller 2 may instruct the magnetic memory device 1 to perform a read operation or a write operation in response to a request (order) from an external host device.

The magnetic memory device 1 is a type of a magnetoresistive random access memory (MRAM). The MRAM is a memory device using a magnetic tunnel junction (MTJ) element as a memory cell and is a type of a resistance change type memory. An MTJ element utilizes a magnetoresistance effect brought by a magnetic tunnel junction. The MTJ element is also referred to as a "magnetoresistance effect element". The magnetic memory device 1 includes a memory cell array 11, an input-output circuit 12, a control circuit 13, a row selection circuit 14, a column selection circuit 15, a write circuit 16, and a read circuit 17.

The memory cell array 11 includes a plurality of memory cells MC, a plurality of word lines WL, and a plurality of bit lines BL. FIG. 1 shows a set of a memory cell MC, a word line WL, and a bit line BL among the plurality of memory cells MC, the plurality of word lines, and the plurality of bit lines. The memory cells MC may store data in a non-volatile manner. The memory cell MC is coupled between a single source line WL and a single bit line BL, and associated with a set including a row and a column. The word line WL is assigned with a row address. The bit line BL is assigned with a column address. One or a plurality of memory cells MC may be specified by selecting a single row and a single or multiple columns.

The input-output circuit 12 is coupled to the memory controller 2, and controls communications between the magnetic memory device 1 and the memory controller 2. The input-output circuit 12 forwards a control signal CNT and a command CMD received from the memory controller 2 to the control circuit 13. The input-output circuit 12 forwards a row address and a column address included in an address signal ADD received from the memory controller 2 to the row selection circuit 14 and the column selection circuit 15, respectively. The input-output circuit 12 forwards data DAT (write data) received from the memory controller 2 to the write circuit 16. The input-output circuit 12 forwards data DAT transferred from the read circuit 17 to the memory controller 2.

The control circuit 13 controls the overall operation of the magnetic memory device 1. The control circuit 13 performs a read operation and a write operation based on a control instructed by a control signal CNT and a command CMD, for example. In a write operation, the control circuit 13 supplies a voltage used in data writing to the write circuit 16. In a read operation, the control circuit 13 supplies a voltage used in data reading to the read circuit 17.

The row selection circuit 14 is coupled to a plurality of word lines WL. Then, the row selection circuit 14 selects a single word line WL specified by the row address. The selected word line WL is electrically coupled to a driver circuit (not shown) for example.

The column selection circuit 15 is coupled to a plurality of bit lines BL. Then, the column selection circuit 15 selects a single or multiple bit lines BL specified by the column address. The selected bit line BL is electrically coupled to a driver circuit (not shown) for example.

The write circuit 16 supplies a voltage used in data writing to the column selection circuit 15 based on the control of the control circuit 13 and the write data DAT received from the input-output circuit 12 (write data). If a current based on write data flows through the memory cell MC, desired data is written in the memory cell MC.

The read circuit 17 includes a plurality of sense amplifiers. The read circuit 17 supplies a voltage used in data reading to the column selection circuit 15 based on a control by the control circuit 13. Then, each sense amplifier determines data stored in the memory cell MC based on a voltage or a current of the selected bit line BL. Thereafter, the read circuit 17 forwards data DAT (read data) corresponding to a determination result to the input-output circuit 12.
<1-1-2> Circuit Configuration of Memory Cell Array 11
FIG. 2 is a circuit diagram illustrating an example of a circuit configuration of the memory cell array 11 provided in the magnetic memory device 1 of the first embodiment. FIG. 2 shows two word lines WL0 and WL1 of the plurality of word lines WL, and two bit lines BL0 and BL1 of the plurality of bit lines BL. As shown in FIG. 2, the plurality of bit lines BL and the plurality of word lines WL intersect each other in the memory cell array 11. Then, a memory cell MC is arranged at an intersection of a bit line BL and a word line WL. In other words, a plurality of memory cells MC are arranged in a matrix pattern. Specifically, a single memory cell MC is coupled between WL0 and BL0, between WL0 and BL1, between WL1 and BL0, and between WL1 and BL1.

Each memory cell MC includes a variable resistance element VR and a selector element SE. A variable resistance element VR and a selector element SE are coupled in series between a bit line BL and a word line WL associated with each other. For example, one end of the variable resistance element VR is coupled to the bit line BL associated therewith. The other end of the variable resistance element VR is coupled to one end of the selector element SE. The other end of the selector element SE is coupled to the word line WL associated therewith. A coupling relationship between the variable resistance element VR and the selector element SE between the bit line BL and the word line WL may be the inverse.

In the description hereinafter, a magnetoresistive effect element VR will be taken as an example of the variable resistance element VR. The resistance state of the magnetoresistive effect element VR may change in accordance with a current flowing via the magnetoresistive effect element VR. The magnetoresistive effect element VR stores data in a non-volatile manner based on a resistance state (resistance value). For example, the memory cell MC that includes the magnetoresistive effect element VR in a high-resistance state stores "1" data. The memory cell MC that includes the magnetoresistive effect element VR in a low-resistance state stores "0" data. Allocation of the data associated with the resistance value of the magnetoresistive effect element VR may be set differently.

The selector element SE controls a supply of a current to the magnetoresistive effect element VR. Specifically, the selector element SE is turned to an off state when a voltage smaller than a threshold voltage of the selector element SE is applied to the memory cell MC, and turned to an on state when a voltage equal to or greater than a threshold voltage of the selector element SE is applied to the memory cell MC. The selector element SE in an off state functions as an insulator having a high resistance value. The selector element SE in an off state suppresses a current flowing in the magnetoresistive effect element VR. The selector element SE in an on state functions as an insulator having a small resistance value. A current flows in the magnetoresistive effect element VR coupled in series to the selector element SE in an on state. As the selector element SE, a bidirectional diode may be used, for example. As the selector element SE, other elements, such as a transistor, may be used.

<1-1-3> Structure of Memory Cell Array 11

Hereinafter, an example of a structure of the memory cell array 11 according to the first embodiment will be described. In the explanation hereinafter, an XYZ orthogonal coordinate system is used. An X direction corresponds to a direction in which the word lines WL extend. A Y direction corresponds to a direction in which the bit lines BL extend. A Z direction is a direction intersecting the X direction and the Y direction, and corresponds to a vertical direction with respect to a surface of a substrate provided in the magnetic memory device 1. The expression "below" and similar expressions indicate a position of a lower coordinate on the Z axis. The expression "above" and similar expressions indicate a position of a higher coordinate on the Z axis. In the perspective views, hatching is applied. The hatching applied in the perspective views is irrelevant to the material or characteristics of the hatched components. In the perspective views and the cross-sectional views, structures such as an inter-layer insulating film are omitted as appropriate.

FIG. 3 is a perspective view illustrating an example of a structure of the memory cell array 11 provided in the magnetic memory device 1 of the first embodiment. As illustrated in FIG. 3, the memory cell array 11 includes a plurality of conductive layers 20 and a plurality of conductive layers 21.

Each of the conductive layers 20 has a portion extending in the X direction and is arranged separately from the others. The portions extending in the X direction in the conductive layers 20 are aligned in the Y direction. Each conductive layer 20 is used as a word line WL. The conductive layers 21 are arranged above an interconnect layer in which the conductive layers 20 are provided. Each of the conductive layers 21 has a portion extending in the Y direction, and is arranged separately from the others. The portions extending in the Y direction in the conductive layers 21 are aligned in the X direction. Each conductive layer 21 is used as a bit line BL.

A single memory cell MC is arranged at an intersection of one of the conductive layers 20 and one of the conductive layers 21 when the structure shown in FIG. 3 is viewed from a top-view perspective. Each memory cell MC is provided in a shape of a pillar extending in the Z direction. In this example, the bottom surface of the memory cell is in contact with the conductive layer 20, and the top surface of the memory cell MC is in contact with the conductive layer 21. Specifically, the selector element SE is provided on the conductive layer 20. The magnetoresistive effect element VR is provided on the selector element SE. The conductive layer 21 is provided on the magnetoresistive effect element VR.

The example in which the magnetoresistive effect element VR is provided above the selector element SE is described; however, the embodiment is not limited to this example. Depending on a circuit configuration of the memory cell array 11, the magnetoresistive effect element VR may be provided below the selector element SE. Other elements or a conductive layer may be provided between the memory cell MC and the conductive layer 20. Similarly, other elements or a conductive layer may be provided between the memory cell MC and the conductive layer 21. The conductive layers 20 and 21 may be referred to as an "interconnect".

FIG. 4 is a cross-sectional view illustrating an example of a cross-sectional structure of the memory cell MC included in the memory cell array 11 provided in the magnetic memory device 1 of the first embodiment. As shown in FIG. 4, the memory cell MC has a structure in which a lower electrode 30, a selector material layer 31, an upper electrode 32, a ferromagnetic layer 40, a non-magnetic layer 41, and a ferromagnetic layer 42 are stacked in this order from the bottom, for example. The set including the lower electrode 30, the selector material layer 31, and the upper electrode 32 corresponds to a selector element SE. The set including the ferromagnetic layer 40, the non-magnetic layer 41, and the ferromagnetic layer 42 corresponds to a variable resistance element VR.

Each of the ferromagnetic layers 40 and 42 is formed of a ferromagnet and has a magnetization direction perpendicular to the film surface. In the magnetic memory device 1, the magnetization direction of the ferromagnetic layer 40 is fixed and the magnetization direction of the ferromagnetic layer 42 is variable, for example. In this case, the ferromagnetic layer 40 functions as a reference layer of the MTJ element, and the ferromagnetic layer 42 functions as a storage layer of the MTJ element. The non-magnetic layer 41 is formed of an insulator, such as MgO, and functions as a tunnel barrier layer.

The ferromagnetic layers 40 and 42 form a magnetic tunnel junction together with the non-magnetic layer 41. Such a magnetoresistive effect element VR functions as a perpendicular magnetization-type MTJ element that utilizes the tunneling magnetoresistance (TMR) effects.

The magnetoresistive effect element VR may take either a low-resistance state or a high-resistance state according to the relative relationship between the magnetization directions of the ferromagnetic layers 40 and 42. Also, the magnetoresistive effect element VR stores data according to the magnetization direction of the ferromagnetic layer 42 (storage layer). For example, the magnetoresistive effect element VR in which the magnetization directions of the reference layer and the storage layer are in an anti-parallel state (AP state) is in a high-resistance state ("1" data). On the other hand, the magnetoresistive effect element VR in which the magnetization directions of the reference layer and the storage layer are in a parallel state (P state) is in a low-resistance state ("0" data).

In this example, the magnetoresistive effect element VR falls into the AP state when a write current is passed in a direction from the ferromagnetic layer 40 toward the ferromagnetic layer 42, and falls into the P state when a write current is passed in a direction from the ferromagnetic layer 42 toward the ferromagnetic layer 40. A write method in which spin torque is injected into the storage layer and the reference layer by passing a write current to the magnetoresistive effect element VR in this manner, and the magnetization direction of the storage layer is thereby controlled, will be referred to as a "spin-injection write method". The magnetoresistive effect element VR is configured so that the magnetization direction of the ferromagnetic layer 40 remains unchanged when a current having a magnitude that may invert the magnetization direction of the ferromagnetic layer 42 is passed to the magnetoresistive effect element VR.

Herein, the expression "the magnetization direction is variable" means that the magnetization direction changes in response to a write current. The expression "the magnetization direction is fixed" means that the magnetization direction does not change in response to a write current. In the magnetoresistive effect element VR, the arrangement of the storage layer and the reference layer may be reversed. The magnetoresistive effect element VR may also include other layers. For example, the magnetoresistive effect element VR may include a shift cancelling layer which suppresses the influence of the stray field of the reference layer, a synthetic anti-ferromagnetic (SAF) structure, and the like. Hereinafter, the memory cell MC that includes the magnetoresistive effect element VR in the AP state will be referred to as a "memory cell MC in the AP state", and the memory cell MC that includes the magnetoresistive effect element VR in the P state will be referred to as a "memory cell MC in the P state".

<1-1-4> Circuit Configuration of Read Circuit 17

FIG. 5 is a circuit diagram showing an example of a circuit configuration of the read circuit 17 provided in the magnetic memory device 1 according to the first embodiment. FIG. 5 shows a pair of the bit line BL and the word line WL included in the memory cell array 11 of the first embodiment and a single memory cell MC coupled between the bit line BL and the word line WL constituting the pair, altogether. As shown in FIG. 5, the read circuit 17 includes sense amplifiers SA1 and SA2, a current-limiting transistor 60, and a sink transistor 61.

The sense amplifier SA1 is coupled to a pair of the bit line BL and the word line WL. The sense amplifier SA1 is a differential amplifier that amplifies a voltage difference between the voltages of the coupled bit line BL and the word line WL. It suffices that the gain of the sense amplifier SA1 is 1 or greater; however, a greater gain is more preferable as long as the gain falls within a possible range. The sense amplifier SA2 is configured to compare an output voltage of the sense amplifier SA1 with a reference voltage VREF to determine data stored in the memory cell MC based on a comparison result. The reference voltage VREF is a voltage used as a threshold for "0" data and "1" data. For example, the sense amplifier SA2 outputs a voltage corresponding to "1" data when an output voltage of the sense amplifier SA1 is equal to or greater than VREF, and outputs a voltage corresponding to "0" data when an output voltage of the sense amplifier SA2 is smaller than VREF. A combination of the pair of the bit line BL and the word line WL coupled to the sense amplifier SA1 may be changed by the row selection circuit 14 and the column selection circuit 15. The pair of the sense amplifiers SA1 and SA2 may be provided for each bit line BL or for each word line WL.

The current-limiting transistor 60 and the sink transistor 61 are an N-type metal oxide semiconductor field effect transistor (MOSFET), for example. The drain end of the current-limiting transistor 60 is coupled to the word line WL. The source end of the current-limiting transistor 60 is coupled to the drain end of the sink transistor 61. The source end of the sink transistor 61 is coupled to a ground node. A ground voltage VSS is applied to the ground node, for example. The ground voltage VSS is 0 V, for example.

A control signal CS is input into the gate end of the current-limiting transistor 60. A control signal SINK is input into the gate end of the sink transistor 61. The control signals CS and SINK are generated by the control circuit 13. The control signal CS may be set to a voltage between an "H" level and an "L" level. In a read operation, the control circuit 13 can perform control through the control signal CS in such a manner that the current-limiting transistor 60 performs a constant-current operation.

In the first embodiment, the current-limiting transistor 60 is provided at each word line WL. The sink transistor 61 may be provided at each word line WL or shared between a plurality of word lines WL. The current-limiting transistor 60 and the sink transistor 61 may be integrated. In this case, the function of the current-limiting transistor 60 and that of the sink transistor 61 are realized by a single transistor.

FIG. 6 is a graph illustrating an example of static characteristics of the current-limiting transistor 60 in the magnetic memory device 1 according to the first embodiment. The horizontal axis indicates a drain-source voltage Vds of the current-limiting transistor 60. The vertical axis indicates a drain current Ids of the current-limiting transistor 60. As shown in FIG. 6, if VLIMIT is applied to the gate end of the current-limiting transistor 60, the current-limiting transistor 60 performs a constant-current operation.

VLIMIT is a voltage between an "H" level and an "L" level. VLIMIT is set in such a manner that an output current of the current-limiting transistor 60 is limited to Ird_max when VLIMIT is applied to the gate end of the current-limiting transistor 60 and Vds exceeds a pinch-off voltage Vp. In other words, the current-limiting transistor 60 may function as a constant-current power supply for causing a constant current Ird_max to flow if VLIMIT is applied to the gate end and the current-limiting transistor 60 operates in a saturation area. The details of Ird_max are described later.

The current-limiting transistor 60 operates in a linear area if VPASS is applied to the gate end. VPASS is a voltage higher than VLIMIT, and corresponds to an "H" level voltage. In the present specification, the current-limiting transistor 60 to which VPASS is applied at the gate end can be regarded as low-resistant interconnect.

<1-2> Operation

A read operation in the magnetic memory device 1 of the first embodiment is described below. In a read operation, the bit line BL and the word line WL are pre-charged. Hereinafter, a period during which pre-charging is performed in a read operation will be called a "pre-charge period".

FIG. 7 is a schematic view illustrating an example of an operation state during the pre-charge period of a read operation in the magnetic memory device 1 according to the first embodiment. As shown in FIG. 7, the control circuit 13 turns the control signals CS and SINK to an "L" level during the pre-charge period. Then, a current path between the word line WL and the ground node is interrupted. The control circuit 13 applies a pre-charge voltage VPCH to the bit line BL during a pre-charge period, and applies a pre-charge voltage VPCL lower than VPCH to the word line WL. At this time, the control circuit 13 couples a driver circuit for supplying a corresponding pre-charge voltage to the bit line BL and the word line WL. The pre-charge voltage VPCL is half a threshold voltage of the selector element SE, for example.

If pre-charging of the bit line BL and the word line WL is completed, the control circuit 13 stops applying a voltage to each of the bit line BL and the word line WL. In other words, the control circuit 13 interrupts a current path between the driver circuit used for pre-charging and the bit line BL and the word line WL. Then, the bit line BL is turned to a floating state. Then, the control circuit 13 starts discharging the bit line BL via the read-target memory cell MC (namely the selected memory cell MC). Hereinafter, a period during which a pre-charged bit line BL is discharged via a selected memory cell MC is called a "discharge period".

FIG. 8 is a schematic view illustrating an example of an operation state during the discharge period of a read operation in the magnetic memory device 1 according to the first embodiment. As shown in FIG. 8, in the discharge period, the control circuit 13 sets the voltage of the control signal CS to VLIMIT, in other words, applies VLIMIT to the gate end of the current-limiting transistor 60. The control circuit 13 turns the control signal SINK to an "H" level and turns the sink transistor 61 to an on state. As a result, a current path between the bit line BL and the word line WL via the memory cell MC and a current path between the word line WL and the ground node are formed. Hereinafter, a current flowing from the bit line BL to the word line WL via the memory cell MC is called "Icell". In the discharge period, the current-limiting transistor 60 performs a constant-current operation, and limits the current flowing in the current-limiting transistor 60 to Ird_max. If the current-limiting transistor 60 performs a constant-current operation, Icell becomes equal to Ird_max.

Thereafter, if a voltage difference between the bit line BL and the word line WL becomes smaller due to the discharging of the bit line BL, the selector element SE of the selected memory cell MC is turned to an off state, and the voltage of the bit line BL is fixed. An amplitude of the voltage of the bit line BL when the selector element SE is turned to an off state varies depending on a type of data stored in the memory cell MC (i.e., the resistance state of the magnetoresistive effect element VR). Hereinafter, an amplitude of the voltage of the bit line BL in a case where the magnetoresistive effect element VR is in a high-resistance state when the selector element SE is turned to an off state will be called "VholdH". The amplitude of the voltage of the bit line BL in a case where the magnetoresistive effect element VR is in a low-resistance state when the selector element SE is turned to an off state will be called "VholdL". VholdH is a voltage higher than VholdL. The sense amplifiers SA1 and SA2 determine whether the data stored in the memory cell MC is "0" data or "1" data, using a voltage difference caused after a discharge period. Hereinafter, a period that is used for determining the data stored in the memory MC in a read operation will be called a "sensing period".

FIG. 9 is a timing chart of a change in a voltage difference between the bit line BL and the word line WL in a read operation in the magnetic memory device 1 according to the first embodiment. The vertical axis indicates a voltage difference V (BLtoWL) between the bit line BL and the word line WL. The solid line indicates a change of V (BLtoWL) if a memory cell MC in the AP state is a read target. The dotted line indicates a change of V (BLtoWL) if a memory cell MC in the P state is a read target. Hereinafter, the change of V(BLtoWL) in a read operation is explained with reference to FIG. 9, using a comparison between the case where a memory cell MC in the AP state is a read target and the case where a memory cell MC in the P state is a read target.

At time t0, the control circuit 13 pre-charges the bit line BL and the word line WL. As a result, the voltage of the bit line BL is increased to the pre-charge voltage VPCH, and the voltage of the word line WL is increased to the pre-charge voltage VPCL. In other words, V (BLtoWL) becomes VPCH-VPCL. After pre-charging is completed, V (BLtoWL) is maintained at VPCH-VPCL.

At time t1, the control circuit 13 starts discharging the bit line BL. In other words, the control circuit 13 stops pre-charging the bit line BL and the word line WL, sets the voltage of the control signal CS to VLIMIT, and turns the control signal SINK to an "H" level. Then, the charge that is charged in the word line WL is discharged to the ground node. Then, the voltage of the word line WL drops, and the voltage difference between two ends of the memory cells MC (i.e., V (BLtoWL)) becomes greater. If V (BLtoWL) exceeds the threshold voltage of the selector element SE, the selector element SE of the memory cell MC is turned to an on state. As a result, the charge of the bit line BL is discharged to the word line WL via the memory cell MC, and the charge of the word line WL is discharged to the ground node via the current-limiting transistor 60.

At time t2, V (BLtoWL) becomes constant in response to a commencement of a constant-current operation in the current-limiting transistor 60. V (BLtoWL) at this time changes in accordance with a resistance difference (ΔR_MTJ) between the magnetoresistive effect element VR in the P state and the magnetoresistive effect element VR in the AP state. Then, the voltage difference ΔV between V (BLtoWL) in the case where the magnetoresistive effect element VR is in the P state and V(BLtoWL) in the case where the magnetoresistive effect element VR is in the AP state is Ird_max*ΔR_MTJ. By time t3, the charge pre-charged in the bit line BL is decreased and the current-limiting transistor 60 cannot maintain the constant-current operation, and V (BLtoWL) is decreased accordingly. Finally at time t4, the selector element SE is turned to an off state ("SE off" in FIG. 9). At this time, if the magnetoresistive effect element VR is in the P state, V (BLtoWL)= VholdL. If the magnetoresistive effect element VR is in the AP state, V (BLtoWL)=VholdH, on the other hand.

In a read operation of the first embodiment, the period from time t2 to time t3 corresponds to a sensing period of a read operation. In other words, in the first embodiment, the sense amplifiers SA1 and SA2 determine data stored in the memory cell MC at a predetermined time in a period between time t2 and time t3. Thereafter, the control circuit 13 completes the read operation. As soon as the data determination by the sense amplifiers SA1 and SA2 finishes, the control circuit 13 may start a process of completing the read operation. In the magnetic memory device 1 according to the first embodiment, it is preferable if the sense amplifiers SA1 and SA2 determine data in a period from time t2 to time t3.

<1-3> Effects of First Embodiment

The above-described magnetic memory device 1 according to the first embodiment can improve a read performance. The details of advantageous effects of the first embodiment are described below.

A magnetic random access memory (MRAM) is a non-volatile memory operable at a high speed and with a low voltage. A 1S1M-type cell-structure memory cell MC in which an MTJ element (magnetoresistive effect element VR) and a selector element SE are stacked can realize a large capacity by high-integration and three-dimensional stacking. In a 1S1M-type cell-structure memory cell MC, both ends of a memory cell MC being discharged after being pre-charged to read a remaining voltage during or after discharging is known as a method of reading information (data) stored in an MTJ element. In this case, a sense amplifier SA determines data stored in the memory cell MC based on a voltage difference ($\Delta V$) between a voltage of both ends of the memory cell MC in the P state and a voltage of both ends of the memory cell MC in the AP state. For this reason, making $\Delta V$ as large as possible allows stable data reading in an MRAM.

FIG. 10 is a graph illustrating an example of a relationship between a read current Icell and a difference $\Delta V$ between a voltage at both ends of a memory cell MC in a parallel state and a voltage at both ends of a memory cell MC in an anti-parallel state. The vertical axis indicates $\Delta V$. The horizontal axis indicates Icell. As shown in FIG. 10, $\Delta V$ tends to take a maximum value at a certain read current and decline in other current values. Specifically, $\Delta V$ may be calculated by $\Delta R*$Icell. $\Delta R$ corresponds to a resistance difference between a memory cell MC in the P state and a memory cell MC in the AP state. If Icell is too small, $\Delta V$ declines by an amount by which Icell declines (Icell attenuation). If Icell attenuates up to Ihold, the selector element SE changes to an off state. If Icell is too large, on the other hand, $\Delta R$ declines and $\Delta V$ declines due to bias dependency of a magneto-resistance ratio (MR ratio) ($\Delta R$ attenuation).

In other words, at a time after discharging of the bit line BL and the word line WL is started in a read operation, a voltage difference between the bit line BL and the word line WL in a case where the magnetoresistive effect element VR included in the memory cell MC is in a parallel state is a first determination voltage. A voltage difference between the bit line BL and the word line WL in a case where the magnetoresistive effect element VR included in the memory cell MC is in an anti-parallel state is a second determination voltage higher than the first determination voltage. Furthermore, a voltage difference between the first determination voltage and the second determination voltage (i.e., $\Delta V$) is greater in a case where Ird_max flows in the memory cell MC than in a case where a current smaller than Ird_max flows in the memory cell MC and in a case where a current larger than Ird_max flows in the memory cell MC.

If Icell is too large, erroneous writing during a read operation (read disturbance) or a tunnel barrier breakage of an MTJ element (breakdown) may occur. In FIG. 10, a read current value that causes read disturbance is indicated by "Idisturb". A read current value that causes a breakdown is indicated "Ibd".

Thus, $\Delta V$ changes in accordance with a magnitude of Icell. In other words, in order to maximize $\Delta V$, it is preferable to optimize Icell. On the other hand, a resistance of an interconnect coupled to the memory cell MC differs depending on an address of the memory cell MC, namely a position of the memory cell MC in the memory cell array 11. Furthermore, since the value of Icell may change in accordance with a resistance of an interconnect, it is difficult to maintain a constant value in the memory cells MC of all addresses.

For this reason, the magnetic memory device 1 of the first embodiment suppresses fluctuations of a read current Icell between the memory cells MC by a constant-current operation of the current-limiting transistor 60. Specifically, the read circuit 17 has a current-limiting transistor 60 coupled between the word line WL and the ground node. The current-limiting transistor 60 is present outside the bit line BL and the word line WL coupled to the sense amplifier SA1. The sense amplifier SA1 is provided so as to detect voltages of both ends of the memory cell MC in accordance with a voltage difference between the bit line BL and the word line WL. In other words, the sense amplifier SA1 of the first embodiment is configured to detect a voltage of the 1S1M-type cell-structure memory cell MC, except for a voltage applied to the current-limiting transistor 60. Thereafter, a gate voltage (VLIMIT) that makes the saturation current of the transistor become Ird_max is applied to the gate end of the current-limiting transistor 60.

FIG. 11 is a graph illustrating an example of a relationship between a read current Icell and a difference $\Delta V$ between a voltage at both ends of a memory cell MC in a parallel state and a voltage of both ends of a memory cell MC in an anti-parallel state in the magnetic memory device 1 of the first embodiment. As shown in FIG. 11, in the magnetic memory device 1 of the first embodiment, $\Delta V$ becomes a maximum value if Icell=Ird_max. Ird_max is smaller than Idisturb that causes a read disturbance and Ibd that causes a breakdown and is larger than Ihold.

In a read operation, both of the bit line BL and the word line WL are pre-charged, and the word line WL is coupled to the ground node, and VLIMIT is applied to the current-limiting transistor 60; as a result, a charge charged in the word line WL is discharged to the ground node. At this time, $\Delta V$ exhibits the $\Delta V$ indicated by the operation point (1). Then, the charge charged in the bit line BL is also discharged to the ground node via the memory cell MC. The current that is discharged to the ground node at this time is limited by the current-limiting transistor 60, and therefore Icell is limited to Ird_max. Then, $\Delta V$ exhibits the $\Delta V$ indicated by the operation point (2). Since Ird_max is set to be smaller than Idisturb and Ibd, read disturbance and a breakdown during discharging can be prevented. Thereafter, when a charge charged in the bit line BL decreases and an output current of the current-limiting transistor 60 cannot maintain Ird_max, Icell declines to Ihold. Then, the selector element SE changes to an off state. At this time, $\Delta V$ exhibits the $\Delta V$ indicated by the operation point (3). In the first embodiment, the voltage is sensed at the operation point (2) or the operation point (3) to read data stored in the memory cell MC by the sense amplifiers SA1 and SA2. In the first embodiment, it is preferable to sense a voltage at the operation point (2) because a read current becomes Ird_max and $\Delta V$ becomes maximum in this case.

A described above, the magnetic memory device 1 of the first embodiment can prohibit an excess supply of Icell to the memory cell MC by limiting Icell at a time of a read operation using the current-limiting transistor 60. Therefore, it is possible to suppress occurrence of a read disturbance and a breakdown in the magnetic memory device 1 of the first embodiment. The magnetic memory device 1 of the first embodiment can maximize $\Delta V$ by limiting a read current at the time of sensing to Ird_max by the current-limiting transistor 60. In this case, the magnetic memory device 1 of the first embodiment can expand a read margin and improve accuracy in data determination (reduce a read error). Thus, the magnetic memory device 1 according to the first embodiment can improve a read performance.

<2> Second Embodiment

The magnetic memory device 1 according to the second embodiment changes a voltage applied to the current-limiting transistor 60 in a read operation in accordance with a progress of the read operation. A description will be given mainly of the points in which the magnetic memory device 1 of the second embodiment differs from that of the first embodiment.

<2-1> Configuration

The configuration of the magnetic memory device 1 according to the second embodiment is similar to those of the first embodiment.

<2-2> Operation

Figure 12:
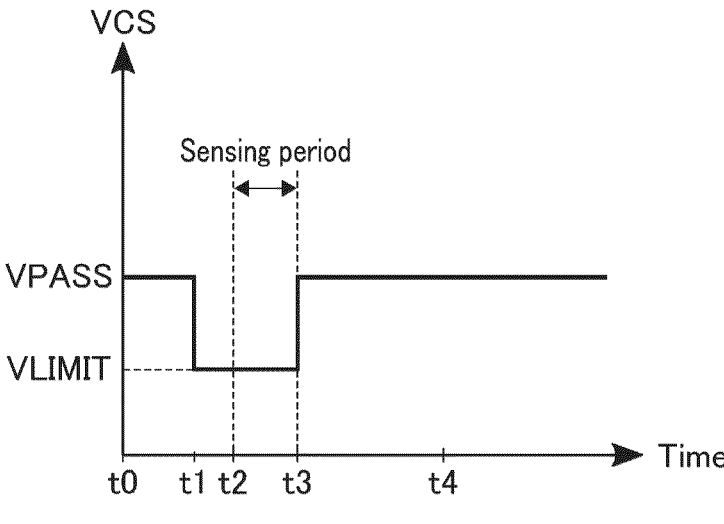
FIG. 12 is a timing chart illustrating an example of a method of controlling a current-limiting transistor in a read operation of a magnetic memory device according to a second embodiment.

FIG. 12 is a timing chart illustrating an example of a method of controlling the current-limiting transistor 60 in a read operation of the magnetic memory device 1 according to the second embodiment. The vertical axis indicates a voltage value VCS of a control signal CS. Time t0 through time t4 shown in FIG. 12 correspond to time t0 through time t4 shown in FIG. 13, which will be described later, respectively.

As shown in FIG. 12, the control circuit 13 sets the voltage value VCS of the control signal CS to VPAS between time t0 and time t1. The control circuit 13 sets the voltage value VCS of the control signal CS to VLIMIT between time t1 and time t3. The control circuit 13 sets the voltage value VCS of the control signal CS to VPASS between time t3 and time t4. The period from time t2 to time t3 corresponds to a sensing period in the second embodiment.

In other words, in a read operation of the second embodiment, the control circuit 13 applies VLIMIT to the gate end of the current-limiting transistor 60 during the sensing period, and limits the read current Icell to Ird_max. The control circuit 13 applies VPASS to the gate end of the current-limiting transistor 60 during a period after the pre-charge period and other than the sensing period, and increases the read current Icell to be larger than Ird_max. Hereinafter, the period after the pre-charge period and other than the sensing period will be called a "non-sensing period".

Figure 13:
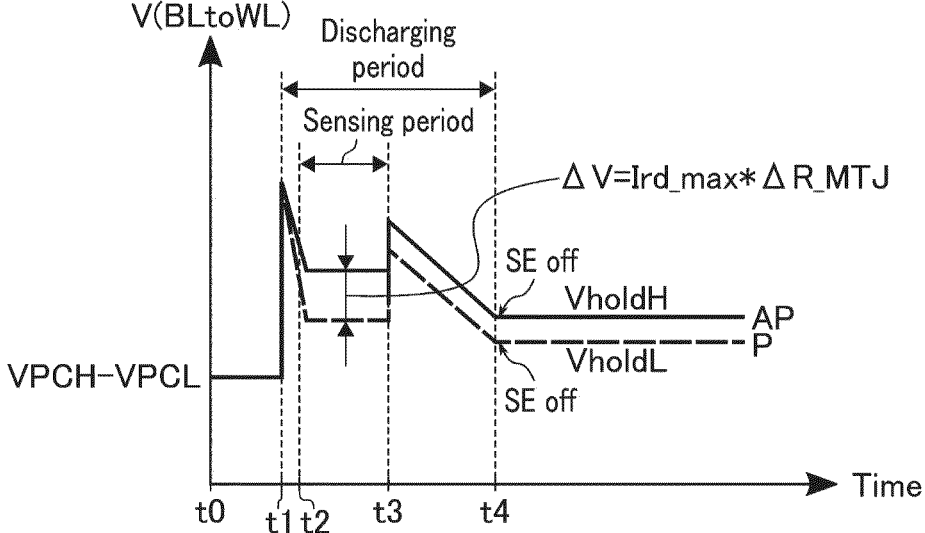
FIG. 13 is a timing chart of a change in a voltage difference between a bit line and a word line WL in a read operation of the magnetic memory device according to the second embodiment.

FIG. 13 is a timing chart of a change in a voltage difference between the bit line BL and the word line WL in a read operation in the magnetic memory device 1 according to the second embodiment. The vertical axis indicates a voltage difference V (BLtoWL) between the bit line BL and the word line WL. Hereinafter, the change of V (BLtoWL) in a read operation of the second embodiment is explained with reference to FIG. 13, using a comparison between the case where a memory cell MC in the AP state is a read target and the case where a memory cell MC in the P state is a read target.

At time t0, the control circuit 13 pre-charges the bit line BL and the word line WL. As a result, the voltage of the bit line BL is increased to the pre-charge voltage VPCH, and the voltage of the word line WL is increased to the pre-charge voltage VPCL. In other words, V (BLtoWL) becomes VPCH-VPCL. After pre-charging is completed, V (BL-toWL) is maintained at VPCH-VPCL.

At time t1, the control circuit 13 starts discharging the bit line BL. In other words, the control circuit 13 stops pre-charging the bit line BL and the word line WL, sets the control signal SINK to VLIMIT, and turns the control signal SINK to an "H" level. At time t1, the control circuit 13 sets the gate voltage of the current-limiting transistor 60 at VLIMIT. At this time, the speed of discharging the charge charged in the word line WL to the ground node is similar to that in the first embodiment. Then, the voltage of the word line WL drops, and the voltage difference between two ends of the memory cell MC (i.e., V(BLtoWL)) becomes greater.

If V (BLtoWL) exceeds the threshold voltage of the selector element SE, the selector element SE of the memory cell MC is turned to an on state. As a result, the charge of the bit line BL is discharged to the word line WL via the memory cell MC, and the charge of the word line WL is discharged to the ground node via the current-limiting transistor 60.

At time t2, the gate voltage of the current-limiting transistor 60 is maintained at VLIMIT, and the current-limiting transistor 60 starts a constant-current operation. Then, V (BLtoWL) becomes constant in response to a commencement of a constant-current operation in the current-limiting transistor 60. V (BLtoWL) at this time changes in accordance with a resistance difference (ΔR_MTJ) between the magnetoresistive effect element VR in the P state and the magnetoresistive effect element VR in the AP state. Then, the voltage difference ΔV between V(BLtoWL) in the case where the magnetoresistive effect element VR is in the P state and V (BLtoWL) in the case where the magnetoresistive effect element VR is in the AP state is Ird_max*ΔR_MTJ. In a read operation of the second embodiment, the sense amplifiers SA1 and SA2 determine data stored in the memory cell MC at a predetermined time in a period between time t2 and time t3.

At time t3, the control circuit 13 changes the gate voltage of the current-limiting transistor 60 from VLIMIT to VPASS, and finishes a constant-current operation at the current-limiting transistor 60. In other words, the current-limiting transistor 60 is turned to a conductive state. Then, the charge of the word line WL is discharged to the ground node via the current-limiting transistor 60 in a conductive state. At this time, since an amount of current flowing in the memory cell MC temporarily increases to be greater than Ird_max, V (BLtoWL) becomes temporarily great. Thereafter, the charge of the bit line BL is discharged to the word line WL via the memory cell MC that includes the selector element SE in an on state, and the charge of the word line WL is discharged to the ground node via the current-limiting transistor 60. As a result, V (BLtoWL) decreases.

Thereafter, when the charge pre-charged in the bit line BL is decreased, the selector element SE is turned to an off state ("SE off" in FIG. 13) at time t4. At this time, if the magnetoresistive effect element VR is in the P state, V(BL-toWL)=VholdL. If the magnetoresistive effect element VR is in the AP state, V(BLtoWL)=VholdH, on the other hand. Thereafter, the control circuit 13 completes the read operation. As soon as the data determination by the sense amplifiers SA1 and SA2 finishes, the control circuit 13 may start a process of completing the read operation.

<2-3> Effects of Second Embodiment

As described above, in the magnetic memory device 1 according to the second embodiment, the current-limiting transistor 60 is caused to perform a constant-current operation only during a period of determining a voltage applied to the memory cell MC (sensing period), and the current limitation by the current-limiting transistor 60 is nullified during periods other than the sensing period (non-sensing period). Specifically, the control circuit 13 applies VLIMIT to the current-limiting transistor 60 during a sensing period, and applies VPASS to the current-limiting transistor 60 during a non-sensing period. After VPASS is applied, a resistance of the current-limiting transistor 60 becomes extremely small, and the current-limiting transistor 60 is turned to a conductive state. As a result, a speed of discharging the bit line BL and the word line WL during a non-sensing period becomes faster than that during a sensing period.

As a result, similarly to the first embodiment, the magnetic memory device 1 according to the second embodiment suppresses an occurrence of a read disturbance and a breakdown, and can improve accuracy of data determination and shorten a cycle time required for a read operation. Thus, the magnetic memory device 1 according to the second embodiment can improve a read performance.

<3> Third Embodiment

The magnetic memory device 1 according to the third embodiment realizes an operation similar to that in the second embodiment by the read circuit 17 having a configuration differing from that in the second embodiment. A description will be mainly given of the points in which the magnetic memory device 1 of the third embodiment differs from those of the first and second embodiments.
<3-1> Configuration
The magnetic memory device 1 according to the third embodiment has a configuration in which the read circuit 17 is replaced with a read circuit 17A in the magnetic memory device 1 of the first embodiment.

FIG. 14 is a circuit diagram showing an example of a circuit configuration of the read circuit 17A provided in the magnetic memory device 1 according to the third embodiment. FIG. 14 shows a pair of the bit line BL and the word line WL included in the memory cell array 11 of the third embodiment, and a single memory cell MC coupled between the bit line BL and the word line WL constituting the pair, altogether. As shown in FIG. 14, the read circuit 17A has a configuration in which a switch circuit 62 is added to the read circuit 17 of the first embodiment.

The switch circuit 62 is coupled between the word line WL and the source of the current-limiting transistor 60. The switch circuit 62 is controlled to an on state or an off state by the control circuit 13. The on state of the switch circuit 62 is a low-resistance state (conductive state) that forms a current path via the switch circuit 62 between the word line WL and the source of the current-limiting transistor 60. The off state of the switch circuit 62 is in a state in which a current path between the word line WL and the source of the current-limiting transistor 60 via the switch circuit 62 is interrupted (non-conductive state). The switch circuit 62 is for example a MOSFET. The switch circuit 62 may be provided at each word line WL or shared between the plurality of word lines WL. The switch circuit 62 may be coupled between the word line WL and the ground node, without the sink transistor 61 being involved therebetween.

The other configurations of the magnetic memory device 1 of the third embodiment are similar to those of the first embodiment.
<3-2> Operation
The time chart showing the change in a voltage of the bit line BL in a read operation of the magnetic memory device 1 according to the third embodiment is the same as the time chart of a read operation of the magnetic memory device 1 according to the second embodiment, which is shown in FIG. 13. A description will be mainly given of the points in which a read operation of the third embodiment differs from that of the second embodiment, with reference to FIG. 3 as appropriate.

At time t0 of a read operation of the third embodiment, the control circuit 13 controls the current-limiting transistor 60, the sink transistor 61, and the switch circuit 62 to be in an off state. Thus, the current path between the word line WL and the ground node is interrupted, and each of the bit line BL and the word line WL is pre-charged at a predetermined voltage in a pre-charge period. As a result, V (BLtoWL) becomes VPCH-VPCL.

FIG. 15 is a schematic view illustrating an example of an operation state during a non-sensing period of a read operation in the magnetic memory device 1 according to the third embodiment. At time t1 of a read operation of the third embodiment, the control circuit 13 sets the control signal SINK to an "H" level, and controls the switch circuit 62 to be turned to an on state, as shown in FIG. 15. A current path is thereby formed between the word line WL and the ground node, with the switch circuit 62 being involved therebetween. As a result, Icell becomes greater than Ird_max due to the discharging via the switch circuit 62. FIG. 15 illustrates a case where the voltage of the control signal CS is an "L" level. The embodiment is not limited to this case, and the voltage of the control signal CS may be set to VLIMIT at time t1. In other words, at time t1, the bit line BL and the word line WL may be discharged via the current-limiting transistor 60 and the switch circuit 62 coupled in parallel.

FIG. 16 is a schematic view illustrating an example of an operation state during a sensing period of a read operation in the magnetic memory device 1 according to the third embodiment. During a period between time t2 and time t3 of a read operation of the third embodiment, the control circuit 13 sets the voltage of the control signal CS to VLIMIT and controls the switch circuit 62 to an off state, as shown in FIG. 16. The current path between the word line WL and the ground node is thus limited to a path that involves the current-limiting transistor 60. As a result, a current flowing from the word line WL to the ground node is limited to Ird_max by the current-limiting transistor 60 during the sensing period. Similarly to the second embodiment, V (BLtoWL) at this time changes in accordance with a resistance difference ($\Delta$R_MTJ) between the magnetoresistive effect element VR in the P state and the magnetoresistive effect element VR in the AP state. Specifically, the voltage difference $\Delta$V between V (BLtoWL) in the case where the magnetoresistive effect element VR is in the P state and V (BLtoWL) in the case where the magnetoresistive effect element VR is in the AP state is Ird_max*$\Delta$R_MTJ. In a read operation of the third embodiment, the sense amplifiers SA1 and SA2 determine data stored in the memory cell MC at a predetermined time within a period between time t2 and time t3, similarly to the second embodiment.

At time t3, the control circuit 13 controls the switch circuit 62 to be turned to an on state, and finishes a constant-current operation by the current-limiting transistor 60. Specifically, a conductive state is formed between the word line WL and the ground node via the switch circuit 62. Then, the charge of the word line WL is discharged to the ground node via the switch circuit 62 in an on state. At this time, since an amount of current flowing in the memory cell MC temporarily increases to be greater than Ird_max, V (BLtoWL) becomes temporarily great. Thereafter, the charge of the bit line BL is discharged to the word line WL via the memory cell MC that includes the selector element SE in an on state, and the charge of the word line WL is discharged to the ground node via the switch circuit 62. As a result, V (BLtoWL) decreases.

As a result, the charge pre-charge in the bit line BL is reduced, and the selector element SE is turned to an off state at time t4 ("SE off" in FIG. 13). At this time, if the magnetoresistive effect element VR is in the P state, V(BLtoWL)=VholdL. If the magnetoresistive effect element VR is in the AP state, V (BLtoWL)=VholdH, on the other hand. Thereafter, the control circuit 13 completes the read operation. As soon as the data determination by the sense amplifiers SA1 and SA2 finishes, the control circuit 13 may start a process of completing the read operation.

<3-3> Effects of Third Embodiment

As described above, the magnetic memory device 1 of the third embodiment has a configuration in which the switch circuit 62 coupled to the current-limiting transistor 60 in parallel is added, in contrast to the second embodiment. Furthermore, the magnetic memory device 1 of the third embodiment turns the switch circuit 62 to an off state only in a period during which a voltage applied to the memory cell MC is determined (sensing period), and causes the current-limiting transistor 60 to perform a constant-current operation, and in a period other than the sensing period (non-sensing period), the magnetic memory device 1 turns the switch circuit 62 to an on state and causes a current path between the word line WL and the ground node to be formed.

As a result, the magnetic memory device 1 of the third embodiment can set Icell in a sensing period to Ird_max based on the limitation by the current-limiting transistor 60, and can increase Icell during a non-sensing period to be higher than Ird_max, similarly to the third embodiment. Thus, the magnetic memory device 1 according to the third embodiment suppresses an occurrence of read disturbance and a breakdown similarly to the first embodiment, and can improve accuracy of data determination and shorten a cycle time required for a read operation similarly to the second embodiment. Thus, the magnetic memory device 1 according to the third embodiment can improve a read performance.

<4> Fourth Embodiment

The magnetic memory device 1 of the fourth embodiment improves a read performance by a configuration in which the current-limiting transistor 60 is provided for each memory cell MC. A description will be given mainly of the points in which the magnetic memory device 1 of the fourth embodiment differs from that of the first through third embodiments.

<4-1> Configuration

The magnetic memory device 1 according to the fourth embodiment has a configuration in which the read circuit 17 is replaced with a read circuit 17B in the magnetic memory device 1 of the first embodiment.

<4-1-1> Circuit Configuration of Read Circuit 17B

FIG. 17 is a circuit diagram showing an example of a circuit configuration of the read circuit 17B provided in the magnetic memory device 1 according to the fourth embodiment. FIG. 17 shows a pair of the bit line BL and the word line WL included in the memory cell array 11 of the fourth embodiment, together with one memory cell MC coupled between the bit line BL and the word line WL constituting the pair. As shown in FIG. 17, if compared to the read circuit 17 of the first embodiment, the read circuit 17B has a configuration in which the sense amplifier SA1 is omitted and the current-limiting transistor 60 is arranged in a different location. Hereinafter, the current-limiting transistor 60 of the fourth embodiment will be called a "current-limiting transistor 60A".

In the read circuit 17B, the sense amplifier SA2 is coupled to the bit line BL. Then, the sense amplifier SA2 amplifies a difference between an output voltage of the bit line BL and the reference voltage VREF. The sense amplifier SA2 determines data stored in the selected memory cell MC based on the amplified voltage. For example, the sense amplifier SA2 of the read circuit 17B outputs a voltage corresponding to "1" data if the voltage of the bit line BL is equal to or greater than VREF, and outputs a voltage corresponding to "0" data if the voltage of the bit line BL is lower than VREF.

The current-limiting transistor 60A is provided for each memory cell MC. In other words, the current-limiting transistor 60A is coupled in series between the associated bit line BL and the word line WL, together with the memory cell MC. Specifically, in the fourth embodiment, one end of the memory cell MC (e.g., the magnetoresistive effect element VR) is coupled to the bit line BL. The other end of the memory cell MC (e.g., the selector element SE) is coupled to the drain end of the current-limiting transistor 60A. The source end of the current-limiting transistor 60A is coupled to the word line WL. A control signal CS is input into the gate end of the transistor 60A. The sink transistor 61 of the fourth embodiment is coupled between the word line WL and the ground node.

<4-1-2> Structure of Memory Cell Array

FIG. 18 is a cross-sectional view illustrating an example of a cross-sectional structure of the memory cell array 11 provided in the magnetic memory device 1 of the fourth embodiment. FIG. 18 shows a structure relating to a bit line BL associated with three memory cells MC arranged in the Y direction, three word lines WL, and three current-limiting transistors 60A. In the following, the structure relating to the current-limiting transistor 60A will be described, focusing on a pair of the conductive layer 20 (word line WL) and the conductive layer 21 (bit line BL). As shown in FIG. 18, the magnetic memory device 1 of the fourth embodiment includes, for example, an insulating layer 70, a conductive layer 71, an insulating layer 72, an insulating film 73, a lower electrode 74, a semiconductor layer 75, and an upper electrode 76.

The insulating layer 70, the conductive layer 71, and the insulating layer 72 are alternately stacked in this order. The set of the insulating layer 70, the conductive layer 71, and the insulating layer 72 is provided in a flat-plate shape expanding in an XY plane, for example, and is located in a layer between a plurality of conductive layers 20 and a plurality of conductive layers 21. In the present example, the height of the bottom surface of the insulating layer 70 is aligned with the height of the top surfaces of the plurality of conductive layers 20 (word lines WL). The height of the upper surface of the insulating layer 72 is aligned with the height of the bottom surface of the memory cells MC (selector elements SE). Each of the insulating layers 70 and 72 may be called a "spacer insulating film".

The set of the insulating film 73, the lower electrode 74, the semiconductor layer 75, and the upper electrode 76 is arranged within a hole penetrating the set of the insulating layer 70, the conductive layer 71, and the insulating layer 72 along the Z direction. In other words, the set of the insulating film 73, the lower electrode 74, the semiconductor layer 75, and the upper electrode 76 is provided in a pillar shape extending along the Z direction. The insulating film 73 is provided in a cylindrical shape extending along the Z direction. It suffices that the planar shape of the insulating film 73 is a cylindrical shape, and it is not limited to a circular shape. The lower electrode 74 is provided on the associated conductive layer 20. The semiconductor layer 75 is provided on the lower electrode 74. The upper electrode 76 is provided on the semiconductor layer 75. The upper surface of the upper electrode 76 is in contact with the bottom surface of the memory cell MC (the bottom surface of the selector element SE). The side surfaces of the lower electrode 74, the semiconductor layer 75, and the upper electrode 76 are surrounded by the insulating film 73. The insulating film 73 may be called a "spacer insulating film".

The structure corresponding to the above-described set of the insulating film 73, the lower electrode 74, the semiconductor layer 75, and the upper electrode 76 is provided for each memory cell MC. The conductive layer 71 corresponds to a gate electrode of the current-limiting transistor 60A. The insulating film 73 corresponds to a gate insulating film of the current-limiting transistor 60A. The semiconductor layer 75 corresponds to a channel of the current-limiting transistor 60A. The control circuit 13 can cause a current between the memory cell MC and the conductive layer 20 via the semiconductor layer 75 (a current via the current-limiting transistor 60A) by applying a voltage corresponding to the control signal CS to the conductive layer 71.

The other configurations of the magnetic memory device 1 of the third embodiment are similar to those of the first embodiment.

<4-2> Operation

A read operation in the magnetic memory device 1 of the fourth embodiment is described below.

A read operation of the fourth embodiment includes a pre-charge period, a discharge period, and a discharging stopped period resulting from a transition of the selector element SE to an off state, similarly to the first embodiment. Specifically, the bit line BL and the word line WL are pre-charged, similarly to the first embodiment. If pre-charging of the bit line BL and the word line WL is completed, the control circuit 13 turns the bit line BL to a floating state and commences discharging the bit line BL and discharging of the word line WL via a read-target memory cell MC.

FIG. 19 is a schematic view illustrating an example of an operation state during the discharge period of a read operation in the magnetic memory device 4 according to the first embodiment. As shown in FIG. 19, the control circuit 13 sets the voltage of the control signal CS to VLIMIT and the control signal SINK to an "H" level in a discharge period, similarly to the first embodiment. As a result, a current path between the bit line BL and the word line WL via the memory cell MC via the memory cell MC and the current-limiting transistor 60A and a current path between the word line WL and the ground node are formed. In a discharge period, the current-limiting transistor 60A performs a constant-current operation, and limits the current flowing in the current-limiting transistor 60A to Ird_max. Thereafter, if a voltage difference between the bit line BL and the word line WL becomes smaller due to the discharging of the bit line BL and the word line WL, the selector element SE of the selected memory cell MC is turned to an off set. In a read operation of the fourth embodiment, data is determined after the selector element SE is turned to an off state.

FIG. 20 is a timing chart of a change in a voltage difference between the bit line BL and the word line WL in a read operation in the magnetic memory device 1 according to the fourth embodiment. The vertical axis indicates a voltage difference V (BLtoWL) between the bit line BL and the word line WL. Hereinafter, the change of V (BLtoWL) in a read operation of the fourth embodiment is explained with reference to FIG. 20, using a comparison between the case where a memory cell MC in the AP state is a read target and the case where a memory cell MC in the P state is a read target.

At time t0, the control circuit 13 pre-charges the bit line BL and the word line WL, similarly to the first embodiment. Then, V (BLtoWL) becomes VPCH-VPL. At time t1, the control circuit 13 stops pre-charging the bit line BL and the word line WL, sets the voltage of the control signal CS to VLIMIT, and turns the control signal SINK to an "H" level. Then, V (BLtoWL) drops in accordance with a current limited by the current-limiting transistor 60A. In the fourth embodiment, since a series voltage of the memory cell MC and that of the current-limiting transistor 60A are detected, no voltage difference occurs between V (BLtoWL) in a case where the memory cell MC is in the AP state and V (BLtoWL) in a case where the memory cell MC is in the P state in the middle of discharging the bit line BL.

If V (BLtoWL) drops to a predetermined voltage as a result of the discharging of the bit line BL, the selector element SE is turned to an off state (SE off). Then, a voltage difference occurs between V (BLtoWL) in a case where the memory cell MC is in an AP state and V (BLtoWL) in a case where the memory cell MC is in a P state. The voltage value of the bit line BL corresponding to the memory cell MC in the AP state when the voltage difference becomes constant is VholdH. The voltage value of the bit line BL corresponding to the memory cell MC in the P state when the voltage difference becomes constant is VholdL.

In the fourth embodiment, a sensing operation is performed after the selector element SE is turned to an off state. Specifically, after a voltage difference occurs, time t2 and time t3 both indicating a sensing period are set. The sense amplifier SA2 determines data of the memory cell MC at a predetermined time in a period between time t2 and time t3 (sensing period). Thereafter, the control circuit 13 completes the read operation. As soon as the data determination by the sense amplifier SA2 finishes, the control circuit 13 may start a process of completing the read operation.

<4-3> Advantageous Effects of Fourth Embodiment

As described above, the magnetic memory device 1 of the fourth embodiment has a configuration in which the current-limiting transistor 60A is located immediately below the 1S1M-type cell structure. On a circuit diagram, the configuration looks like the current-limiting transistor 60A being inserted between the word line WL and the memory cell MC of a 1S1M-type cell structure. In a read operation, it suffices that a gate potential of the current-limiting transistor 60A is the same throughout all memory cells MC. For this reason, the gate electrode of the current-limiting transistor 60A may not necessarily be in a line shape but in a plate shape. In other words, a step of processing the current-limiting transistor 60A into a line shape becomes unnecessary in the step of forming the current-limiting transistor 60A. Therefore, it is possible to manufacture the structure of the magnetic memory device 1 according to the fourth embodiment with a high density, compared to a 1T1M-type MRAM not using the selector element SE.

Furthermore, in the magnetic memory device 1 of the fourth embodiment, a current flowing in a 1S1M-type cell structure memory cell MC is limited to Ird_max by VLIMIT applied to the gate end of the current-limiting transistor 60A. In other words, in the magnetic memory device 1 of the fourth embodiment, a read disturbance and a breakdown during a read operation can be suppressed by setting Ird_max lower than Idisturb and Ibd. Thus, the magnetic memory device 1 according to the fourth embodiment can improve a read performance.

<5> Others

In the foregoing embodiments, the bit lines BL and the word lines WL have a symmetric relationship. In other words, in the foregoing embodiments, the bit lines BL can be read as the word lines WL, and the word lines WL can be read as the bit lines BL. In the foregoing embodiments, an example where the current-limiting transistor 60 is a MOS-FET grounded to a source is explained; however, the embodiments are not limited to this example. As the current-limiting transistor 60, a joint field-effect transistor (JFET) or a bipolar joint transistor (BJT) grounded to an emitter may be used. If a bipolar joint transistor is used as the current-limiting transistor 60, the gate voltage is read as a base current, the gate end is read as a base end, the drain end is read as a collector end, and the source end is read as an emitter end. The current-limiting transistor 60 and the sink transistor 61 may be simply called a "transistor".

In the foregoing embodiment, Idisturb corresponds to a write current. If a write current flows in the magnetoresistive effect element VR, the magnetoresistive effect element VR changes to a parallel state or an anti-parallel state based on a direction in which the write current flows. Idisturb is 40 to 80 µA (microampere), for example. The value of Idisturb is based on a value of a write current if the element resistance RA of the MTJ element is 5 $\Omega\mu m^2$. Ibd is 250 to 315 µA, for example. The value of Ibd is based on a value calculated based on Ohm's law (Ibd=Vbd/R) if RA=5 $\Omega\mu m^2$, the resistance value R of the MTJ element is 4 to 5 kΩ, and the breakdown voltage Vbd=1.26 V.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A magnetic memory device comprising:
a first interconnect;
a second interconnect;
a memory cell that includes a magnetoresistive effect element and a selector element, the magnetoresistive effect element and the selector element being coupled in series between the first interconnect and the second interconnect;
a transistor coupled between the second interconnect and a ground node;
a first sense amplifier configured to amplify a voltage difference between the first interconnect and the second interconnect;
a second sense amplifier configured to determine data stored in the memory cell based on a result of comparing an output voltage of the first sense amplifier with a reference voltage; and
a control circuit configured to perform a read operation, wherein
in the read operation, the control circuit is further configured to:
charge the first interconnect to a first voltage; and
discharge, after charging the first interconnect, the first interconnect via the transistor by applying a second voltage to a gate end of the transistor, wherein the transistor to which the second voltage is applied limits a current flowing between one end and the other end of the transistor to a first current; and
causes the first sense amplifier to amplify a voltage difference between the first interconnect that has been discharged via the transistor and the second interconnect and causes the second sense amplifier to determine data stored in the memory cell.

2. The magnetic memory device of claim 1, wherein the second voltage is a voltage between a first logic level voltage and a second logic level, the second logic level being a reverse logic level of the first logic level.

3. The magnetic memory device of claim 1, wherein at a first time after discharging of the first interconnect is started in the read operation, a voltage difference between the first interconnect and the second interconnect is, if the magnetoresistive effect element included in the memory cell is in a parallel state, a first determination voltage, and if the magnetoresistive effect element included in the memory cell is in an anti-parallel state, a second determination voltage higher than the first determination voltage, and
a voltage between the first determination voltage and the second determination voltage is greater in a case where the first current flows in the memory cell than in a case where a second current smaller than the first current flows in the memory cell and a case where a third current larger than the first current flows in the memory cell.

4. The magnetic memory device of claim 3, wherein the difference is greatest if the first current flows in the memory cell.

5. The magnetic memory device of claim 1, wherein the magnetoresistive effect element is further configured to change between a parallel state and an anti-parallel state if a current equal to or greater than a fourth current flows, and
the first current is smaller than the fourth current.

6. The magnetic memory device of claim 1, wherein the fourth current is 40 to 80 µA.

7. The magnetic memory device of claim 1, wherein the magnetoresistive effect element is configured to allow a tunnel barrier destruction to occur when a current equal to or greater than a fifth current flows,
the first current is smaller than the fifth current.

8. The magnetic memory device of claim 7, wherein the fifth current is 250 to 80 µA.

9. The magnetic memory device of claim 1, wherein in the read operation, the control circuit is further configured to:
apply the second voltage to a gate end of the transistor in a first period during which the second sense amplifier determines, after the first interconnect is charged, data stored in the memory cell; and
apply a third voltage higher than the second voltage to a gate end of the transistor in a period after the first interconnect is charged except for the first period.

10. The magnetic memory device of claim 1, further comprising:
a switch circuit coupled to the transistor in parallel, wherein
in the read operation, the control circuit is further configured to:
control the switch circuit to be in an off state in a period during which the second sense amplifier determines data; and
control the switch circuit to be in an on state in a period other than a period during which the second sense amplifier determines data.

* * * * *